United States Patent
Ramos et al.

(10) Patent No.: US 12,158,176 B2
(45) Date of Patent: Dec. 3, 2024

(54) ATTACHMENT SYSTEM FOR ENCLOSURE COVER

(71) Applicant: Hoffman Enclosures, Inc., Anoka, MN (US)

(72) Inventors: David Ramos, Madrid (ES); Adrian Serrano, Madrid (ES); Juan Pablo Rincon, Tres Cantos (ES)

(73) Assignee: Hoffman Enclosures, Inc., Anoka, MN (US)

( * ) Notice: Subject to any disclaimer, the term of this patent is extended or adjusted under 35 U.S.C. 154(b) by 730 days.

(21) Appl. No.: 17/332,514

(22) Filed: May 27, 2021

(65) Prior Publication Data

US 2021/0372446 A1 Dec. 2, 2021

Related U.S. Application Data

(60) Provisional application No. 63/030,514, filed on May 27, 2020.

(51) Int. Cl.
| | |
|---|---|
| *F16B 5/06* | (2006.01) |
| *E05B 65/52* | (2006.01) |
| *H02G 3/14* | (2006.01) |

(52) U.S. Cl.
CPC ............. *F16B 5/06* (2013.01); *H02G 3/14* (2013.01); *E05B 65/52* (2013.01)

(58) Field of Classification Search
CPC ........... F16B 5/06; F16B 21/065; H02G 3/14; H02B 1/46; H05K 5/0008; H05K 5/0021;
(Continued)

(56) References Cited

U.S. PATENT DOCUMENTS

| | | | | |
|---|---|---|---|---|
| 1,613,315 A | * | 1/1927 | Dols ...................... | E05D 15/48 292/257 |
| 2,404,169 A | * | 7/1946 | Gidden ............... | F16B 13/0808 411/340 |

(Continued)

FOREIGN PATENT DOCUMENTS

| | | | | |
|---|---|---|---|---|
| CA | 2147964 C | * | 1/2007 | ........... A47B 88/423 |
| CN | 104600640 A | | 5/2015 | |

(Continued)

OTHER PUBLICATIONS

Espacenet machine translation, DE102010008040A1, claims and description Apr. 8, 2011 (Year: 2024).*

(Continued)

*Primary Examiner* — Kristina R Fulton
*Assistant Examiner* — Steven A Tullia
(74) *Attorney, Agent, or Firm* — Quarles & Brady LLP

(57) ABSTRACT

An attachment system to secure an enclosure cover over an enclosure opening is provided. The attachment system includes an outer insert, an anchor block, and a locking body. The outer insert extends through the enclosure cover and includes an anchor portion that extends at least partly to an inner side of the enclosure. The anchor block, which includes one or more flexible arms that are configured to engage an interior structure of the enclosure, can be secured to the anchor portion of the outer insert. The locking body can be rotatably secured relative to the anchor block and can be rotated from an outer side of the enclosure cover between a locked orientation and an unlocked orientation.

20 Claims, 15 Drawing Sheets

(58) Field of Classification Search
CPC .... H05K 5/0217; H05K 5/03; Y10T 292/225; Y10T 292/1099; Y10T 292/308; Y10T 292/0898; Y10T 292/0894; Y10S 292/11; Y10S 292/38; E05B 17/2046; E05B 65/52; E05B 65/5253; E05B 65/5261; E05B 65/5246; E05B 65/006; E05B 65/0057; B65D 45/20; B65D 45/16; B65D 45/02
USPC .................................. 220/328, 327, 325, 324
See application file for complete search history.

(56) References Cited

U.S. PATENT DOCUMENTS

| | | | | |
|---|---|---|---|---|
| 2,681,558 | A * | 6/1954 | Tyska | B60K 15/0409 292/257 |
| 2,872,234 | A * | 2/1959 | Brinton | E05B 65/006 292/55 |
| 2,933,338 | A * | 4/1960 | Byars | E05D 13/08 292/DIG. 20 |
| 2,950,141 | A * | 8/1960 | Koff | F16B 13/0808 292/256.73 |
| 3,744,828 | A * | 7/1973 | Goldberg | E05B 65/5253 206/404 |
| 4,007,516 | A * | 2/1977 | Coules | F16B 21/04 411/548 |
| 4,500,120 | A * | 2/1985 | Ridgewell | E05B 65/0858 292/19 |
| 4,674,930 | A * | 6/1987 | Poe | H05K 7/142 24/607 |
| 4,952,106 | A * | 8/1990 | Kubogochi | F16B 19/1081 411/48 |
| 5,361,925 | A * | 11/1994 | Wecke | H02G 3/14 220/325 |
| 5,368,427 | A * | 11/1994 | Pfaffinger | F16B 21/04 24/DIG. 54 |
| 5,593,265 | A * | 1/1997 | Kizer | F16B 21/02 403/348 |
| 5,669,108 | A * | 9/1997 | Ferrari | A47B 88/43 16/383 |
| 6,206,606 | B1 * | 3/2001 | Mita | F16L 3/123 248/71 |
| 6,325,427 | B1 * | 12/2001 | Daoud | E05C 3/34 220/325 |
| 6,955,515 | B2 * | 10/2005 | Barina | F16B 21/02 411/509 |
| 7,207,758 | B2 * | 4/2007 | Leon | F16B 21/02 411/45 |
| 7,377,141 | B2 * | 5/2008 | Javaux | E02D 29/1427 292/99 |
| 7,553,116 | B2 * | 6/2009 | Lesecq | F16B 19/1081 411/41 |
| 7,652,886 | B2 * | 1/2010 | Li | H01L 23/4006 248/510 |
| 7,874,779 | B2 * | 1/2011 | Csik | F16B 5/0208 411/553 |
| 8,586,877 | B1 | 11/2013 | Shemtov | |
| 9,243,656 | B2 | 1/2016 | Pfannenberg | |
| 9,601,871 | B2 | 3/2017 | Schmidt et al. | |
| 9,624,957 | B2 * | 4/2017 | Fukumoto | F16B 21/065 |
| 9,637,950 | B2 * | 5/2017 | Covington | E05B 35/008 |
| 9,917,429 | B2 * | 3/2018 | Kaufman | H02G 3/088 |
| 11,345,220 | B2 * | 5/2022 | Sardelli | B60J 5/0468 |
| 11,879,272 | B2 * | 1/2024 | Shiu | E05B 65/0067 |
| 2005/0152765 | A1 * | 7/2005 | Kato | F16B 19/1081 411/45 |
| 2008/0056816 | A1 * | 3/2008 | Sussenbach | F16B 5/065 403/348 |
| 2009/0094808 | A1 * | 4/2009 | Jan | F16B 45/049 24/601.1 |
| 2009/0263210 | A1 * | 10/2009 | Loewe | F16B 19/1081 411/553 |
| 2010/0119325 | A1 * | 5/2010 | Edland | F16B 5/0657 411/182 |
| 2010/0140964 | A1 * | 6/2010 | Schmidt | E05C 19/06 292/347 |
| 2012/0103034 | A1 * | 5/2012 | Shartel | E05B 13/101 411/190 |
| 2015/0014319 | A1 * | 1/2015 | Norris | B65D 41/02 220/324 |
| 2015/0048634 | A1 * | 2/2015 | Gauntt | E05B 35/008 292/338 |

FOREIGN PATENT DOCUMENTS

| | | | | |
|---|---|---|---|---|
| CN | 205025206 | U | 2/2016 | |
| CN | 206299240 | U | 7/2017 | |
| DE | 1173158 | B * | 11/1961 | H02B 1/42 |
| DE | 2447763 | A1 | 4/1976 | |
| DE | 3444660 | C1 * | 5/1986 | F16H 41/24 |
| DE | 3931180 | A * | 4/1990 | F16B 19/1081 |
| DE | 4424151 | C1 * | 7/1995 | E05D 5/08 |
| DE | 4438408 | A1 * | 5/1996 | F16B 12/24 |
| DE | 202008010262 | U1 * | 11/2008 | F16B 19/1081 |
| DE | 102010008040 | A1 * | 8/2011 | F16B 21/065 |
| DE | 102013011878 | A1 * | 1/2015 | B60S 1/0447 |
| DE | 102013111400 | A1 * | 4/2015 | B60R 13/0206 |
| DE | 202016007457 | U1 * | 1/2017 | E05C 3/042 |
| DE | 102016004187 | A1 | 10/2017 | |
| DE | 102017002987 | B3 * | 6/2018 | E05B 35/008 |
| EP | 0175012 | B1 | 8/1988 | |
| EP | 0524412 | B1 * | 6/1992 | F16B 21/02 |
| EP | 1158123 | B1 | 10/2004 | |
| EP | 1434327 | B1 * | 3/2007 | H02G 3/088 |
| EP | 1900890 | B1 | 12/2011 | |
| EP | 2119856 | B1 | 1/2014 | |
| EP | 2456989 | B1 * | 7/2016 | F16B 21/02 |
| EP | 2619862 | B1 | 9/2016 | |
| FR | 3041718 | A1 * | 3/2017 | F16B 19/1081 |
| GB | 2621869 | A * | 2/2024 | E02D 29/14 |
| KR | 20170052312 | A | 5/2017 | |
| KR | 101847986 | B1 | 4/2018 | |
| TW | I262981 | B * | 5/2005 | E05B 63/08 |
| WO | WO-2018205268 | A1 * | 11/2018 | E05B 63/08 |

OTHER PUBLICATIONS

Espacenet machine translation, DE4438408A1, claims and description, Feb. 5, 1996 (Year: 2024).*

* cited by examiner

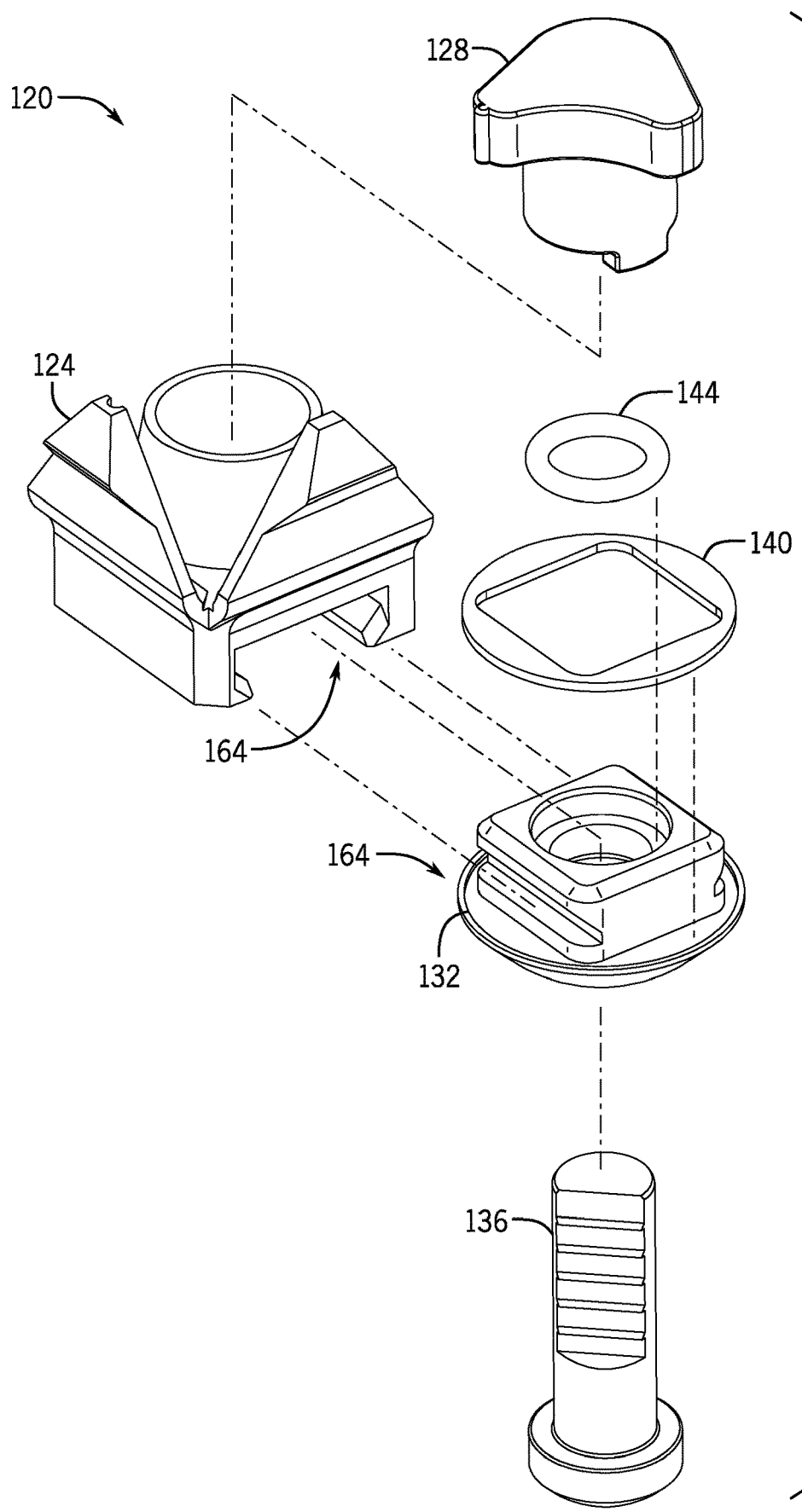

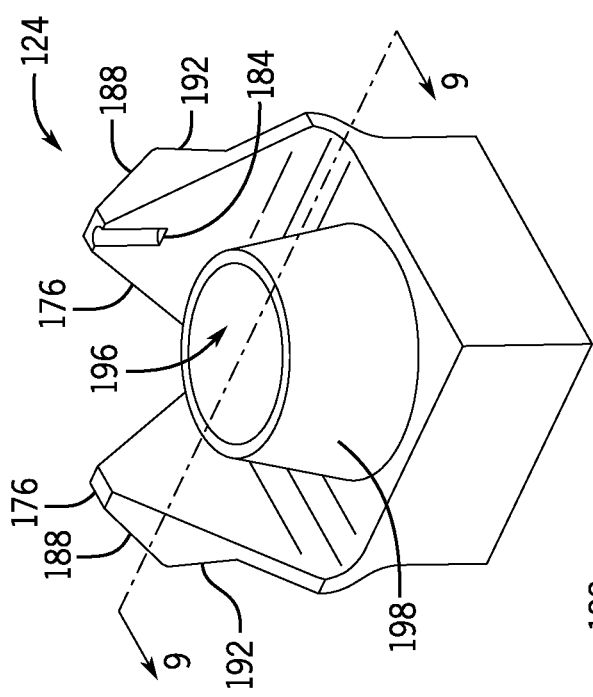
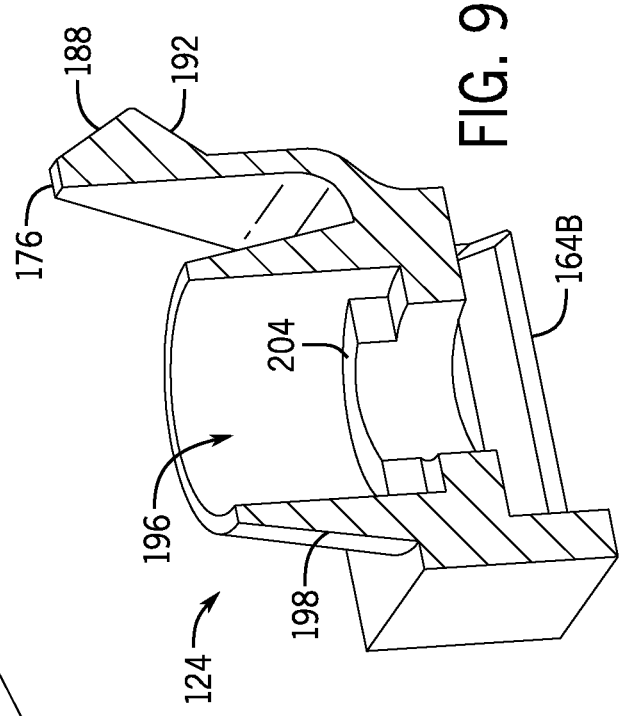
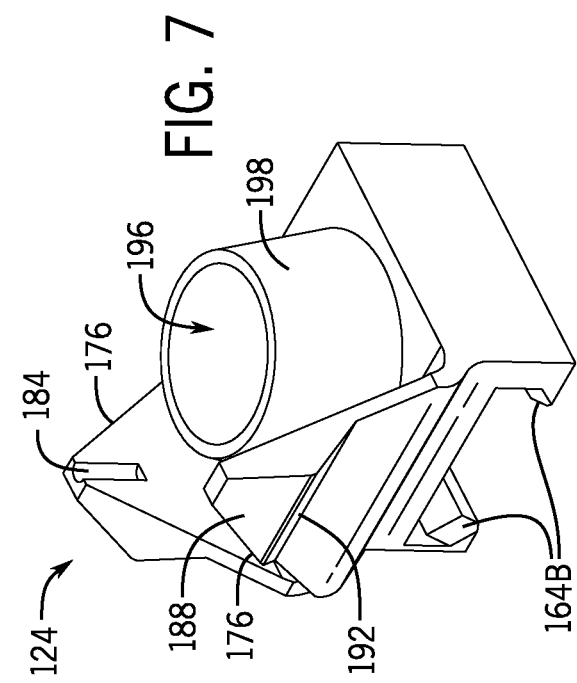

ATTACHMENT SYSTEM FOR ENCLOSURE COVER

CROSS-REFERENCE TO RELATED APPLICATIONS

This application claims priority to U.S. patent application No. 63/030,514, titled Attachment System for Enclosure Cover and filed May 27, 2020, the entirety of which is incorporated herein by reference.

STATEMENT REGARDING FEDERALLY SPONSORED RESEARCH OR DEVELOPMENT

Not applicable.

BACKGROUND OF THE TECHNOLOGY

Installation for terminal boxes and other enclosures, along with other operations, require attaching and removing a cover. The cover is often attached in a semi-permanent manner, so that the cover does not include handles and hinges that allow regular opening and closing of the cover.

BRIEF SUMMARY OF THE TECHNOLOGY

Some embodiments of the invention provide an attachment system to secure an enclosure cover over an enclosure opening of an enclosure. The attachment system includes an outer insert that is configured to extend through the enclosure cover from an outer side of the enclosure cover to an inner side of the enclosure cover. The outer insert includes an anchor portion that is configured to extend at least partly to the inner side of the enclosure cover. The attachment system further includes an anchor block that is configured to be secured to the anchor portion of the outer insert with the anchor block extending on the inner side of the enclosure cover. The anchor block includes a flexible arm that is configured to engage an interior structure of the enclosure. The attachment system also includes a locking body that is configured to be rotatably secured relative to the anchor block. The locking body can be rotated from the outer side of the enclosure cover between a locked orientation and an unlocked orientation. In the locked orientation, a protrusion on the locking body prevents the flexible arm from flexing away from the interior structures of the enclosure to secure the anchor block relative to the enclosure. In the unlocked orientation, the protrusion is displaced and can allow the flexible arm to flex away from the interior structure of the enclosure to release the anchor block relative to the enclosure.

Some embodiments of the invention provide an attachment system for an enclosure with an enclosure opening and an enclosure cover. The enclosure cover includes a first cover opening in a first corner region and a second cover opening in a second corner region. The attachment system includes a first attachment assembly that is configured to engage the enclosure cover at the first cover opening and a second attachment assembly that is configured to engage the enclosure cover at the second opening. Each of the first and second attachment assemblies include an outer insert, an anchor, and a locking body. The outer insert has an anchor portion and an outer skirt, the anchor portion is configured to extend through the respective cover opening to an inner side of the enclosure cover with the outer skirt on an outer side of the enclosure cover. The anchor block includes a support bore and first and second flexible arms. Each of the flexible arms include an engagement portion that is configured to engage a respective interior structure of the enclosure. The anchor block is configured to slidably engage the anchor portion of the outer insert to be secured to the anchor portion with the flexible arms on the inner side of the enclosure cover. The locking body includes first and second locking protrusions and is configured to be rotatably received in the support bore.

In one embodiment, each of the locking bodies is configured to be rotated relative to the anchor block, from the outer side of the enclosure cover, between a locked orientation and an unlocked orientation. In the locked orientation, the first and second locking protrusions engage the first and second flexible arms, respectively, to prevent the first and second flexible arms from flexing away from the respective interior structure of the enclosure and thereby secure the anchor block and the attachment assembly relative to the enclosure to secure the enclosure cover over the enclosure opening. In the unlocked orientation, the first and second locking protrusions allow the first and second flexible arms, respectively, to flex away from the interior structure of the enclosure and thereby release the anchor block and the attachment assembly relative to the enclosure, to allow removal of the enclosure cover from over the enclosure opening.

Some embodiments of the invention provide a method of installing an enclosure cover over an enclosure opening of an enclosure. The method includes ensuring that each attachment assembly of a plurality of attachment assemblies is in an unlocked orientation, each of the attachment assemblies being engaged with the enclosure cover at a corresponding enclosure opening of a plurality of enclosure openings. The method further includes orienting the enclosure cover so that each of the attachment assemblies is aligned with a respective corner of the enclosure opening. The method further includes moving the enclosure cover to cover the enclosure opening and thereby engaging each of two flexible arms of each of the attachment assemblies with a corresponding interior structure of the enclosure, with the two flexible arms of each of the attachment assemblies engaging the corresponding interior structures on opposing sides of the corresponding corner of the enclosure opening. The method further includes securing the enclosure cover at the enclosure opening by, from an outer side of the enclosure cover, rotating a locking body of each of the attachment assemblies to secure the two flexible arms of each of the attachment assemblies in locked engagement with the corresponding interior structures of the enclosure.

Some embodiments of the invention provide a method of installing an enclosure cover over an enclosure opening of an enclosure. The method includes ensuring that each attachment assembly of a plurality of attachment assemblies is in an unlocked orientation, each of the attachment assemblies being engaged with the enclosure cover at a corresponding enclosure opening of a plurality of enclosure openings. The method further includes orienting the enclosure cover so that each of the attachment assemblies is aligned with a respective side of the enclosure opening. The method further includes moving the enclosure cover to cover the enclosure opening and thereby engaging a single flexible arm of the attachment assembly with a corresponding interior structure of the enclosure, the single flexible arm of the attachment assembly engaging the corresponding interior structure at a side of the enclosure opening.

Some embodiments of the invention provide an attachment system to secure an enclosure cover to an enclosure. The attachment system can include an outer insert, an anchor block, and a locking body. The outer insert can be configured to extend through the enclosure cover from an outer side of the enclosure cover to an inner side of the enclosure cover. The anchor block can include a flexible arm that is configured to engage an interior structure of the enclosure. The anchor block can be configured to be secured to the anchor portion of the outer insert at the inner side of the enclosure cover. The locking body can have a cam member. The locking body can be configured to be rotatably secured relative to the anchor block and to be rotated from the outer side of the enclosure cover between a locked orientation and an unlocked orientation. In the locked orientation, the cam member prevents the flexible arm from flexing away from the interior structure of the enclosure and thereby secures the anchor block relative to the enclosure. In the unlocked orientation, the cam member allows the flexible arm to flex away from the interior structure of the enclosure and thereby releases the anchor block relative to the enclosure.

In some embodiments, an attachment system to secure an enclosure cover to an enclosure can include an actuation insert. The actuation insert can be configured to extend through an outer insert, an anchor block, and into a locking bod. The actuation insert can be rotatable from outside of the enclosure to rotate the anchor block between locked and unlocked orientations.

In some embodiments, an attachment system to secure an enclosure cover to an enclosure can include a cam member. The cam member can include an engaging portion. The engaging portion can have a protrusion configured to extend into a recess of a flexible arm to provide one or more of a tactile response or an auditory response when a locking body reaches the locked orientation.

In some embodiments, an attachment system to secure an enclosure cover to an enclosure can include a cam member. The cam member can include first and second engaging portions. An anchor block can include a first flexible arm and a second flexible arm. Each of the first and second engaging portions can be configured to prevent the respective first and second flexible arms from being urged away from an interior structure of the enclosure to secure the anchor block relative to the enclosure when a locking body is in a locked orientation.

In some embodiments, an attachment system to secure an enclosure cover to an enclosure can include first and second flexible arms. The first and second flexible arms can be arranged to engage an interior structure of the enclosure on opposite sides of a corner of an enclosure opening.

In some embodiments, an attachment system to secure an enclosure cover to an enclosure can include a first engaging portion. The first engaging portion can include a first lobe of a cam member and a second engaging portion can include a second lobe of the cam member.

In some embodiments, an attachment system to secure an enclosure cover to an enclosure can include an anchor block and an outer insert having an anchor portion. The anchor block and the anchor portion of the outer insert collectively include a rail and groove arrangement that is configured to secure the anchor block to the outer insert as the anchor block is slid along an inner side of the enclosure cover.

In some embodiments, an attachment system to secure an enclosure cover to an enclosure can include a rail and groove arrangement contoured to urge an outer flange of an outer insert towards the enclosure cover as an anchor block is slidably engaged with an anchor portion.

In some embodiments, an attachment system to secure an enclosure cover to an enclosure can include a first stop on a locking body configured to contact a second stop on an anchor block to prevent rotation of the locking body past a locked orientation.

In some embodiments, an attachment system to secure an enclosure cover to an enclosure can include an anchor block having a support bore formed through a collar that rotatably receives a locking body.

In some embodiments, an attachment system to secure an enclosure cover to an enclosure can include a flexible arm that includes an end portion with a first oblique surface that is configured to urge the flexible arm to flex away from an interior structure of the enclosure as the enclosure cover is moved towards the enclosure, with a locking body in an unlocked orientation, to cover an enclosure opening.

In some embodiments, an attachment system to secure an enclosure cover to an enclosure can include a flexible arm with an end portion. The end portion can include a second oblique surface that is configured to urge the flexible arm to flex away from an interior structure of the enclosure as the enclosure cover is moved away from the enclosure, with a locking body in an unlocked orientation, to open an enclosure opening.

Some embodiments of the invention provide an attachment system for an enclosure with an enclosure opening and an enclosure cover, the enclosure cover including a first cover opening and a second cover opening that extend between an inner side and an outer side of the enclosure cover. The attachment system can include a first attachment assembly that is configured to engage the enclosure cover at the first cover opening and a second attachment assembly that is configured to engage the enclosure cover at the second cover opening. Each of the first and second attachment assemblies can include an anchor block and a locking body. The anchor block can be configured to be secured relative to the inner side of the enclosure cover in alignment with a respective one of the first or second cover openings. The anchor block can include one or more flexible arms configured to engage a respective interior structure of the enclosure. The locking body can include a cam member. The locking body can be configured to be rotatably secured to the anchor block. Each of the locking bodies can be configured to be accessed through the respective first or section cover opening, from the outer side of the enclosure, to be rotated relative to the corresponding anchor block between a locked orientation and an unlocked orientation. In the locked orientation, the cam member engages the one or more flexible arms to prevent the one or more flexible arms from flexing away from the respective interior structure of the enclosure, the one or more flexible arms thereby securing the enclosure cover to the enclosure. In the unlocked orientation, the cam member allows the one or more flexible arms to flex away from the respective interior structure of the enclosure and thereby release the enclosure cover from the enclosure.

In some embodiments, an enclosure cover can include first and second cover openings that extend between an inner side and an outer side of the enclosure cover. The first cover opening can be in a first corner region of the enclosure cover and the second cover opening can be in a second corner region of the enclosure cover. An attachment system can include first and second attachment assemblies, each having first and second flexible arms. For each of the first and second attachment assemblies, the first flexible arms is configured to engage an enclosure at a different side of the first or second cover opening, respectively, than the second flexible arm, to secure the enclosure cover to the enclosure.

In some embodiments, an attachment system can include first and second attachment assemblies. Each of the first and second attachment assemblies can include an outer insert with: an anchor portion configured to extend inside of an enclosure cover at a respective one of a first or second cover opening, and an outer flange configured to extend outside of the enclosure cover at the respective one of the first or second cover openings. An anchor block can be configured to be secured to the anchor portion to secure the first or second attachment assembly, respectively to the enclosure cover.

In some embodiments, an attachment system can include an actuation insert. The actuation insert can be configured to extend through each of an outer insert, an anchor block, and into a cavity of a locking body. The cavity of the locking body can surround the actuation insert within an enclosure so that a conductive path is not formed from an outer side of an enclosure cover to an inner side of the enclosure cover via the actuation insert.

Some embodiments of the invention provide a method of securing an enclosure cover to an enclosure. The method can include ensuring that each attachment assembly of a plurality of attachment assemblies is in an unlocked orientation. Each of the attachment assemblies can be engaged with the enclosure cover at a corresponding plurality of enclosure openings. The method can include orienting the enclosure cover so that each of the attachment assemblies is aligned with a respective corner of the enclosure. The method can include moving the enclosure cover toward the enclosure to flexibly engage two flexible arms of each of the attachment assemblies with a corresponding interior structure of the enclosure. The two flexible arms of each of the attachment assemblies can flexibly engage the corresponding interior structures on orthogonal sides of the respective corner of the enclosure opening. The method can include securing the enclosure cover at the enclosure by, from an outer side of the enclosure cover, rotating a locking body of each of the attachment assemblies to secure the two flexible arms of the attachment assembly in locked engagement with the corresponding interior structures of the enclosure.

In some embodiments, a method of securing an enclosure cover to an enclosure can include moving the enclosure cover to cover the enclosure, which causes end portions of flexible arms to snap past corresponding interior structures of the enclosure.

In some embodiments, a method of securing an enclosure cover to an enclosure can include, from an outer side of the enclosure cover, rotating a locking body of each of a plurality of attachment assemblies to release two flexible arms of each attachment assembly from a locked engagement with corresponding interior structures of the enclosure and moving the enclosure cover away from the enclosure opening.

In some embodiments, a method of securing an enclosure cover to an enclosure can include moving the enclosure cover away from the enclosure opening which causes end portions of flexible arms to snap past corresponding interior structures of the enclosure.

BRIEF DESCRIPTION OF THE SEVERAL VIEWS OF THE DRAWINGS

FIG. 4 is an exploded isometric view of an attachment assembly of the attachment system of FIG. 3.

FIG. 7 is a top, left isometric view of an anchor block of the attachment assembly of FIG. 4.

FIG. 8 is a top, right isometric view of the anchor block of the attachment assembly of FIG. 4.

FIG. 9 is a cross-sectional isometric view of the anchor block of the attachment assembly of FIG. 4 taken along line 9-9 of FIG. 8.

Figure 1:
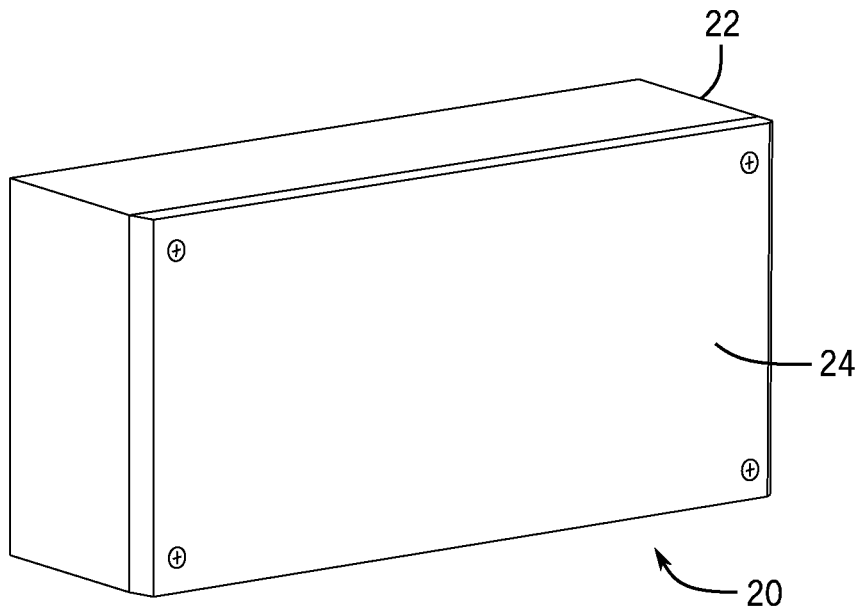
FIG. 1 is a front isometric view of an enclosure that includes a conventional enclosure cover.

While the technology is susceptible to various modifications and alternative forms, specific embodiments thereof have been shown by way of example in the drawings and are herein described in detail. It should be understood, however, that the description herein of specific embodiments is not intended to limit the technology to the particular forms disclosed, but on the contrary, the intention is to cover all modifications, equivalents, and alternatives falling within the spirit and scope of the technology as defined by the appended claims.

DETAILED DESCRIPTION OF THE TECHNOLOGY

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "rotatably secured" describes a component that is secured to another component while still being able to rotate relative to that other component, along at least one rotational degree of freedom.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As briefly discussed above, it may be useful to securely attach and selectively remove a cover of an enclosure, such as a terminal box, including when the cover is not provided with handles, hinges, or other similar hardware. In conventional systems, threaded fasteners may be configured to engage internal brackets of an enclosure to removably secure a cover to the enclosure. However, these systems may require both hands of a user to install the enclosure cover, with one hand holding the enclosure cover and the other hand rotating the threaded fasteners. Additionally, these system may even require multiple workers to cooperate to install an enclosure cover, with one worker holding the cover in place and another worker installing the threaded fasteners. Further, the brackets on the enclosure that receive the threaded fasteners may need to be welded in place to extend into the enclosure opening. This can increase manufacturing costs and time, and may also partially obstruct the associated enclosure opening, thereby somewhat reducing the utility of the enclosure.

Embodiments of the invention can address these or other issues. For example, some embodiments include an attachment system that is secured to and partly extends through an enclosure cover. The attachment system can include flexible arms that are configured to resiliently engage interior structures of an enclosure. With the flexible arms engaged with the interior structures, a locking body can then be actuated from outside of the enclosure in order to secure the flexible arms against unintended disengagement from the interior structures and thereby secure the enclosure cover to the enclosure. Notably, in some embodiments, flexible arms of an attachment system can temporarily secure a cover in appropriate alignment relative to an enclosure opening so that the cover may not need to be held by a user while the locking body is rotated to secure the flexible arms. Thus, some embodiments may allow a single user to attach (or remove) an enclosure cover, without additional assistance. Further, in some embodiments, flexible arms of an attachment system can be configured to engage an interior structure of an enclosure rather than an added bracket. For example, some flexible arms can be configured to engage interior walls of an enclosure that define the outer perimeter of an enclosure opening. Thus, some embodiments may allow an enclosure cover to be secured without the use of brackets that may need to be separately attached to an enclosure or that extend into an enclosure opening and thereby reduce the effective area of the opening.

Figure 2:
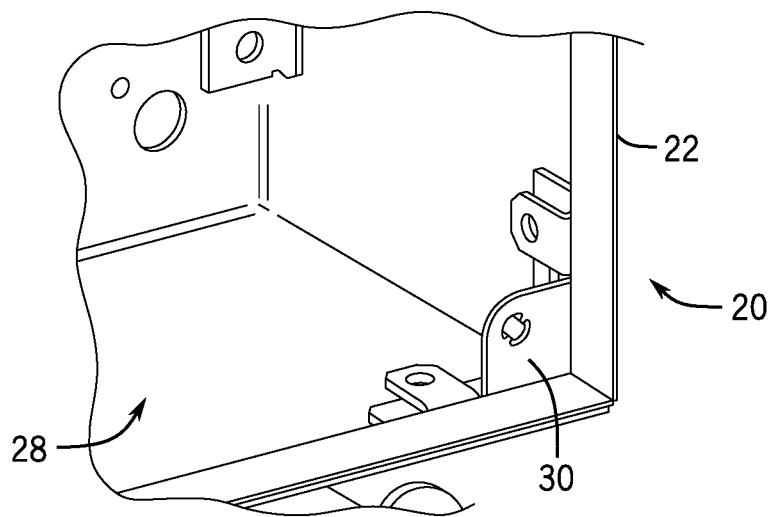
FIG. 2 is a partial front isometric view of an enclosure opening of the enclosure of FIG. 1, including an internal bracket for securing the enclosure cover to the enclosure.

FIGS. 1 and 2 illustrate a conventional enclosure 20. The enclosure 20 includes an enclosure body 22 and an enclosure cover 24 that, when coupled to the enclosure body 22, covers an enclosure opening 28. The enclosure body 22 includes internal brackets 30 that may be welded, or otherwise secured, proximate to each corner of the enclosure opening 28. The internal brackets 30 extend into the enclosure opening 28, thereby partially blocking the enclosure opening 28. In other words, the enclosure 20, according to the illustrated conventional design, does not allow unobstructed access to the inside of the enclosure body 22 via the enclosure opening 28.

The internal brackets 30 include mounting holes that are dimensioned and positioned to align with mounting holes in the enclosure cover 24. During installation of the enclosure cover 24 to the enclosure body 22, a user must align the mounting holes in the enclosure cover 24 with the mounting holes in the internal brackets 30. After careful and precise alignment of the enclosure cover 24 with the enclosure body, the user may then insert fasteners (e.g., threaded fasteners) at each corner of the enclosure cover 24 while the enclosure cover 24 is held steadily in place. The fasteners extend from outside of the enclosure 20, through each of the mounting holes of the enclosure cover 24 and the internal brackets 30, and towards the inside of the enclosure body, thereby fixing the enclosure cover 24 relative to the enclosure body 22. As also noted above, the necessary steps for installing the enclosure cover 24 for the enclosure 20 may be cumbersome, sometimes requiring multiple users for effective execution.

Figure 3:
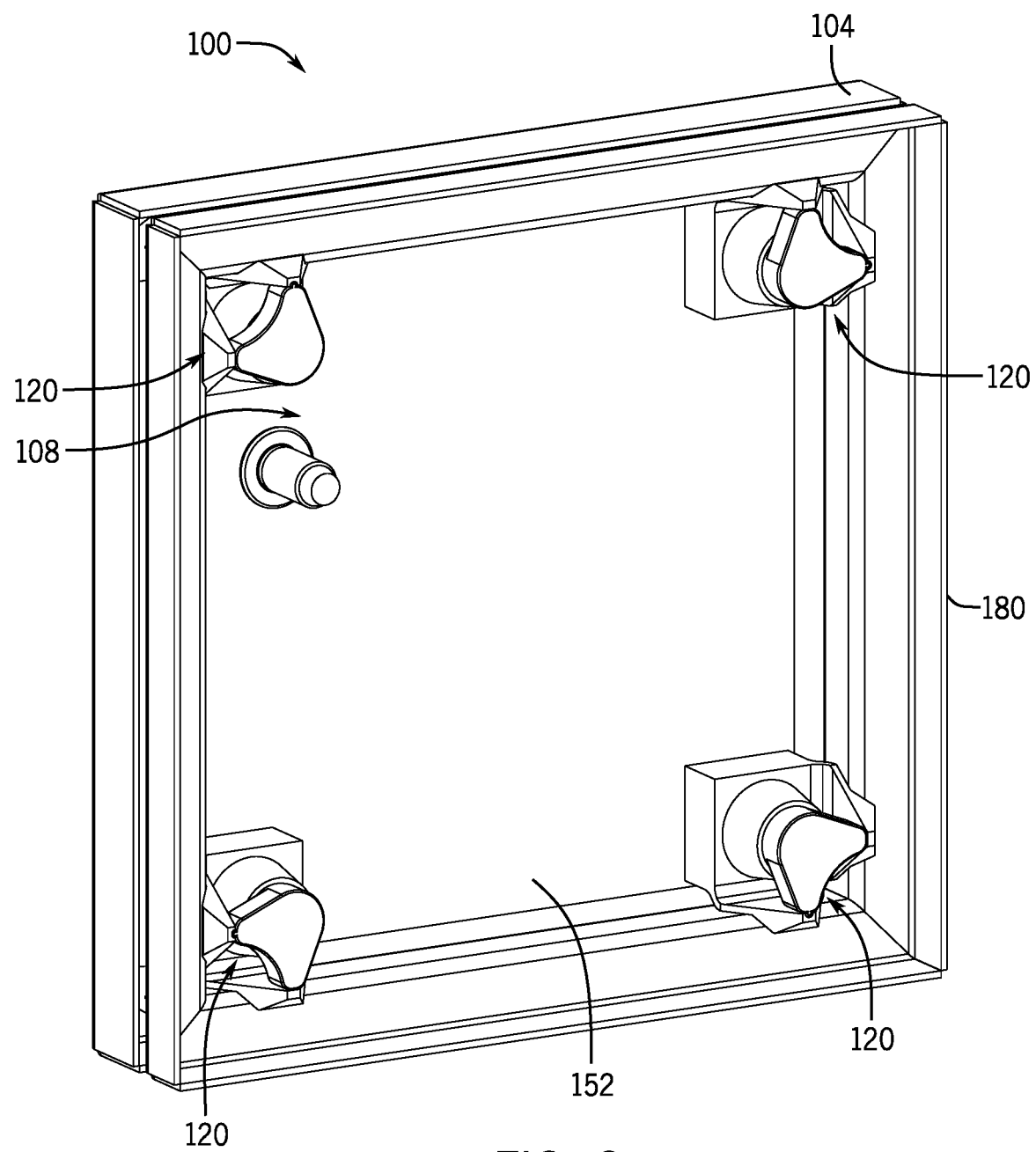
FIG. 3 is an isometric view of an attachment system and an enclosure cover secured to an enclosure according to one embodiment of the invention.

FIG. 3 illustrates an attachment system 100, according to an embodiment of the invention. The attachment system 100 can be used to removably secure an enclosure cover 104 over an enclosure opening 108 of an enclosure (not fully shown). In the illustrated embodiment, the enclosure cover 104 is configured as a removable cover, however, in other embodiments, an enclosure cover equipped with the attachment system 100 can include a door, a panel (e.g., as shown in FIG. 3), or any other cover for an opening in an enclosure. Additionally, some covers for an enclosure opening, such as a door, for example, can be partly secured to an enclosure via the attachment system 100 and partly by other components (e.g., hinges).

The attachment system 100 provides a self-centering method of attachment for the enclosure cover 104 to the enclosure opening 108, such that the enclosure cover 104 requires less precision alignment when compared with the enclosure cover 14 for the enclosure 10 of the prior art, as described above. Additionally, the attachment system 100 eliminates the need for obstructive attachment components disposed on an enclosure body, such as the internal brackets 30 described above (see FIG. 2). As a result, there is unobstructed access to the inside of the enclosure via the enclosure opening 108. Further, the attachment system 100 enables one-handed (and one-user) completion installation by allowing a user to snap-fit the enclosure cover 104 to the enclosure body, via the attachment system 100, before adjusting the attachment system 100 to a locked orientation.

In the embodiment shown, the attachment system 100 for the enclosure cover 104 includes four attachment assemblies 120. However, other configurations are possible. For example, in some configurations, an enclosure cover may be equipped with only two attachment assemblies, one at each of two diagonally opposing corners. In some embodiments, an enclosure cover may include two attachment assemblies disposed at each of the two top (or other) corners of an enclosure cover. Additionally, in some embodiments, an enclosure cover may include an attachment assembly disposed along an edge of an enclosure cover. For example, the enclosure cover can include six attachment assemblies, four disposed at each corner, and two disposed along two sides of the enclosure cover (e.g., the two longest opposing sides). A variety of configurations of attachment assemblies, including as shown in FIG. 3 and otherwise discussed above, can similarly enable self-centering and one-handed (and one-user) installation operations.

Referring now to FIG. 4, the attachment assembly 120 includes an anchor block 124, a locking body 128, an outer insert 132, and an actuation insert 136. The attachment assembly 120 further includes a sealing gasket 140 and an O-ring 144. The sealing gasket 140 is configured to engage both the enclosure cover 104 and the outer insert 132 and the O-ring is 144 configured to create a seal between the outer insert 132 and the actuation insert 136. Thus, in some configurations, the attachment assembly 120 can be used with leak-proof enclosures.

In one embodiment, each of the anchor block 124, the locking body 128, and the outer insert 132 comprise composite materials and the actuation insert 136 is metal, although use of other materials or combinations of materials is possible. In general, the metal material selection for the actuation insert 136 can provide durability, although other materials are possible. For example, all of the components of the attachment assembly 120, including the actuation insert 136, may comprise a composite material. The use of composite materials can prevent a conductive path from being formed between the inside of the enclosure to an outside of the enclosure via the attachment system 100 and can thereby help to protect against accidental shocks.

Figure 6:
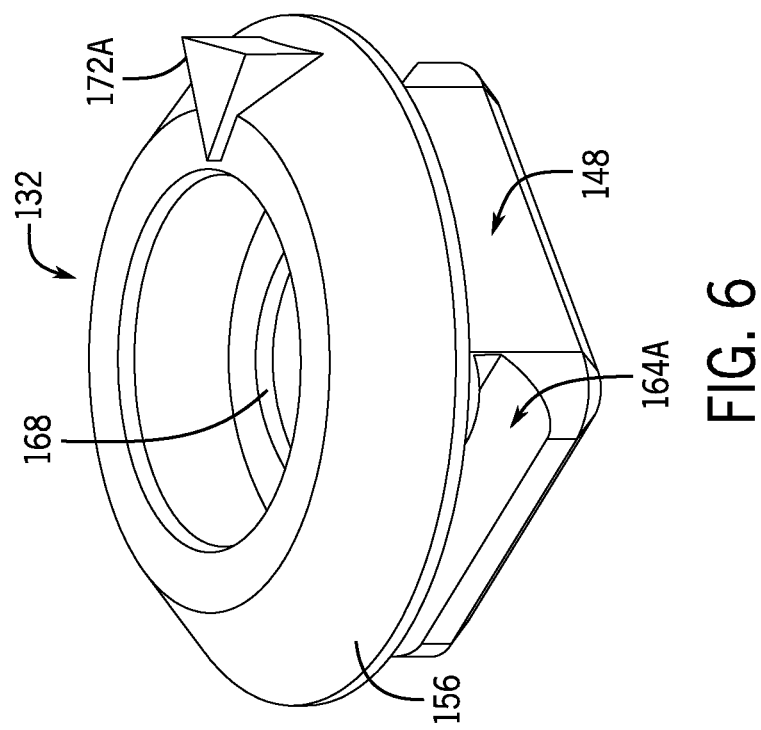
FIG. 6 is a top isometric view of the outer insert of the attachment assembly of FIG. 4.
Figure 5:
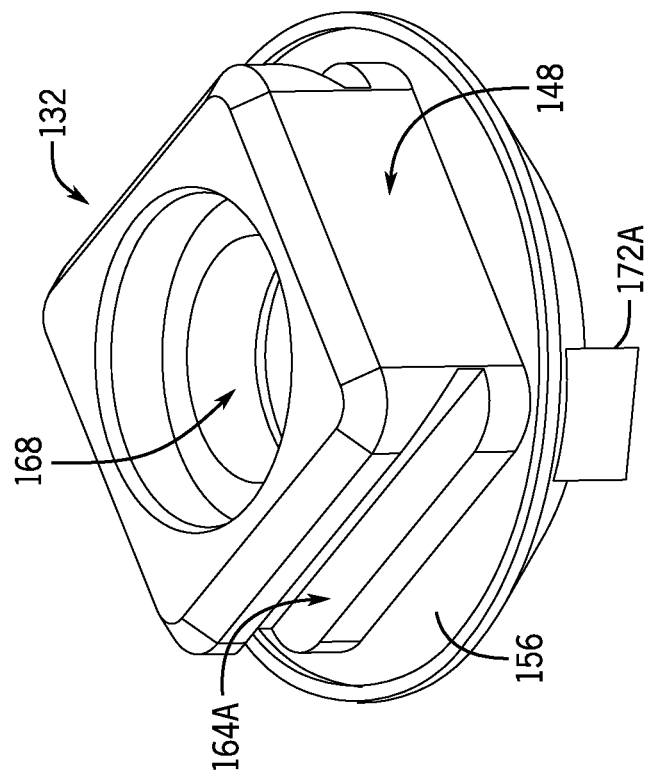
FIG. 5 is a bottom isometric view of an outer insert of the attachment assembly of FIG. 4.

As illustrated in FIGS. 5 and 6, the outer insert 132 includes an anchor portion 148 that is configured to extend at least partly from an outer side of the enclosure cover 104 to an inner side 152 of the enclosure cover 104 (e.g., via a hole though the enclosure cover 104 with similar geometry). The outer insert 132 further includes an outer flange 156 that is configured to seat against the outer side of the enclosure cover 104 (e.g., to form a seal via the intervening gasket 140, as shown in FIG. 4). In the embodiment shown, the outer flange 156 is a round outer skirt that extends fully around an opening 160 in the enclosure cover 104 (see, for example, FIG. 14). In other embodiments, the outer flange 156 may be another shape, such as a square, for example, and is not limited to a round structure. The anchor portion 148 includes part of a rail and groove arrangement 164 (see FIG. 17) that is configured to secure the anchor block 124 to the outer insert 132 as the anchor block 124 is slid along the inner side 152 of the enclosure cover 104. In the illustrated embodiment, the rail and groove arrangement 164 includes a set of grooves 164A that are configured to receive corresponding rails of the anchor block 124, as further described below. In other embodiments, however, an opposite (or other) configuration may be possible.

The outer insert 132 further includes an opening 168 that extends axially therethrough and is dimensioned to receive the actuation insert 136 (see FIG. 4). Additionally, the outer insert 132 includes an indicator 172A disposed in an outer surface of the outer flange 156. As illustrated, the indicator 172A is configured as a triangular protrusion from the outer flange 156. In use, the indicator 172A is configured to align with an indicator 172B on the actuation insert 136 (see, for example, FIGS. 12 and 13) when the attachment assembly 120 is in the locked orientation. While the indicator 172A is illustrated as a triangular protrusion, other features and symbols are possible. For example, the indicator 172A may be one or more of a protrusion, an indentation, and a marking of any variety of shapes. In other embodiments, an indicator on the outer insert 132 or the actuation insert 136 may be used to indicate when the attachment assembly is in an unlocked orientation.

The anchor block 124 is configured to be secured to the anchor portion 148 of the outer insert 132 with the anchor block 124 extending on the inner side 152 of the enclosure cover 104. As shown in FIGS. 7-9, the anchor block 124 generally includes at least one flexible arm 176 that is configured to engage an interior structure 180 of the enclosure. As illustrated in FIGS. 7 and 8, the anchor block 124 includes multiple flexible arms 176 configured to engage multiple different interior structures of the enclosure (or multiple parts of a single interior structure, such as the interior structure 180 of FIG. 3). The flexible arm 176 includes a recess 184 that can provide a tactile or auditory response when engaging with the locking body 128, as will be described in greater detail below.

The flexible arm 176 further includes an end portion with a first oblique surface 188 and a second oblique surface 192. The first oblique surface 188 is configured to urge the flexible arm 176 to flex away from the interior structure 180 of the enclosure as the enclosure cover 104 is moved toward the enclosure when the attachment assembly 120 is in the unlocked orientation. The second oblique surface 192 is configured to urge the flexible arm 176 to flex away from the interior structure 180 as the enclosure cover 104 is moved away from the enclosure when the attachment assembly 120 is in the unlocked orientation. Each of the first oblique surface 188 and the second oblique surface 192 allow the enclosure cover 104 to be snapped in and out from the enclosure opening 108, which enables the one-handed installation, as discussed above.

In the illustrated embodiment, the oblique surface 188 exhibits a smaller angle than the oblique surface 192, relative to a direction of insertion of the anchor portion 148 into an enclosure opening. Accordingly, the flexible arm 176 may be more easily deflected out of engagement with an interior structure during installation of the cover 104 onto an enclosure than during removal of the cover 104 from the enclosure. In other embodiments, however, other configurations are possible. Also in the illustrated embodiment, the oblique surfaces 188, 192 are generally planar. This may result in particularly optimal engagement and installation in some embodiments. In other embodiments, however, oblique surfaces can be compound planar surfaces, curved surfaces, compound curved surfaces, or a variety of combinations thereof.

The anchor block 124 further includes part of the rail and groove arrangement that includes the grooves 164A of the outer insert 132. In the illustrated embodiment, the rail and groove arrangement includes rails 164B that can engage the groove 164A, although reversed (or other) configurations are also possible. In particular, the rails 164B extend within a blind opening of the anchor block 124, so that the rails 164B are only accessible from one side of the anchor block 124. The opposing wall of the blind opening can thus provide a backstop for the outer insert 132 when the rail and groove arrangement is engaged, i.e., when the grooves 164A slidably receive the rails 164B. Accordingly, for example, the attachment assembly 120 can be installed on the enclosure cover 104 without the anchor block 124 sliding too far, i.e., out of workable alignment. In some embodiments, a mechanical detent or other device can be provided to further secure the rail and groove arrangement, or other attachment mechanism, in an appropriately engaged alignment.

Figure 10:
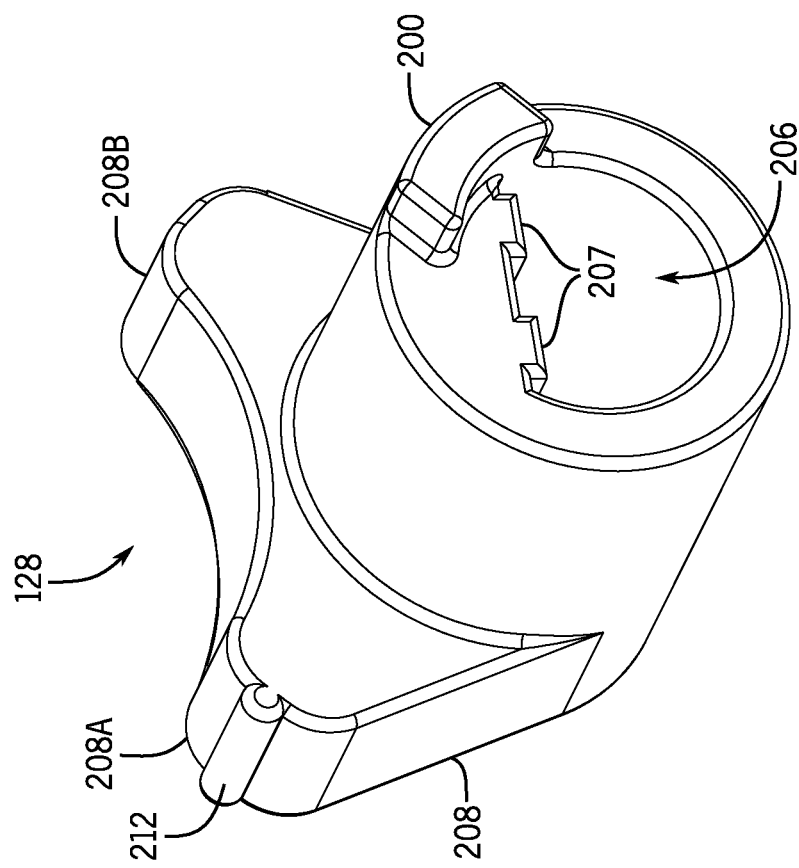
FIG. 10 is bottom isometric view of a locking body of the attachment assembly of FIG. 4.
Figure 17:
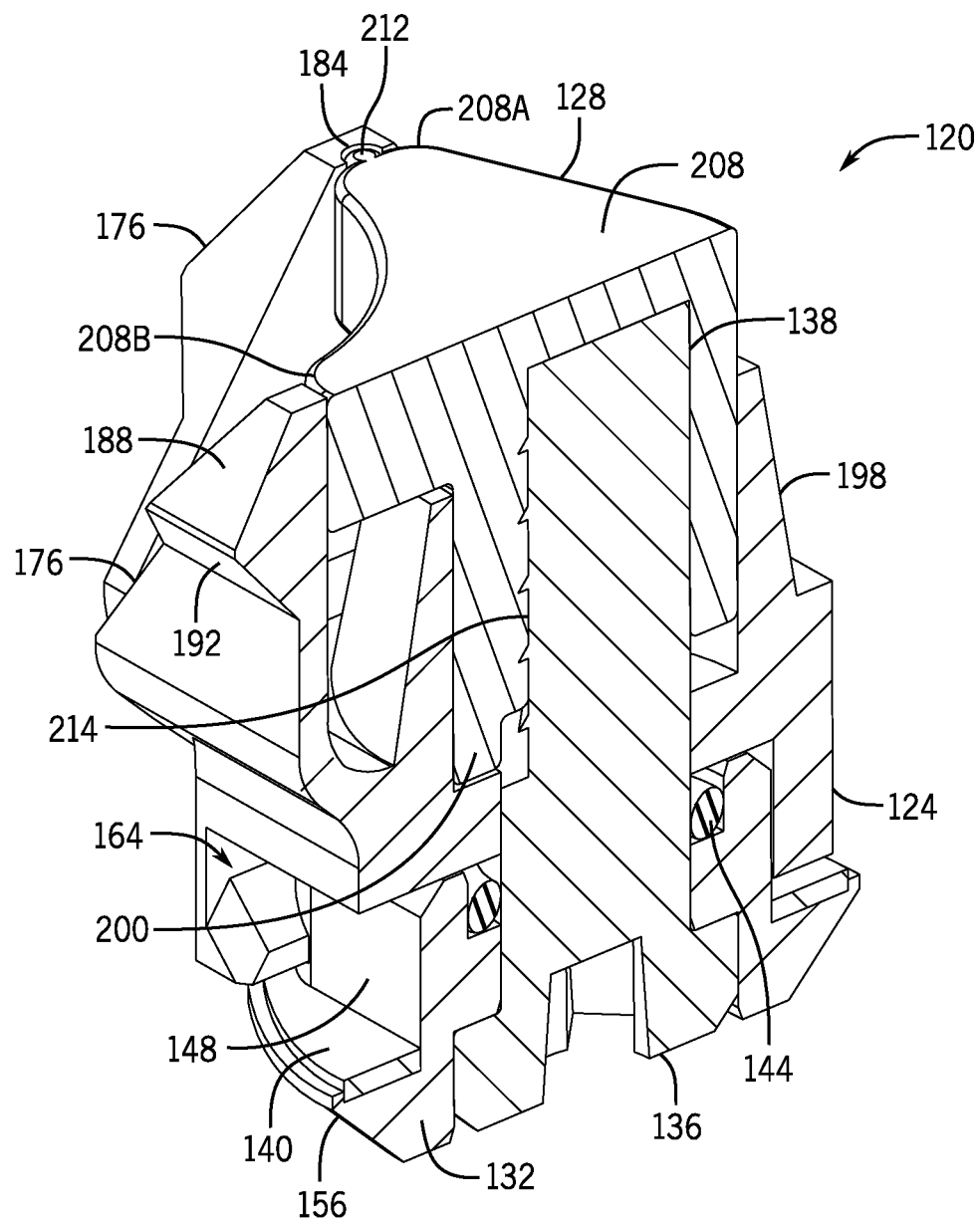
FIG. 17 is a cross-sectional isometric view of the attachment assembly of FIG. 4 taken along line 17-17 of FIG. 16.

As further illustrated in FIGS. 7-9 the anchor block 124 also includes a support bore 196 extending through a collar 198. The collar 198 extends from the anchor block 124 so that each of the flexible arms 176 are separate and spaced apart from the collar 198 (see also FIG. 17). The support bore 196 that is configured to rotatably receive the locking body 128 (see also FIG. 15). As shown in FIG. 10, the locking body 128 includes a first stop 200 that is configured to contact a second stop 204 within the support bore 196 of the collar 198 (see FIG. 9). In use, when the first stop 200 engages the second stop 204, the locking body 128 is prevented from rotating past the locked orientation. The support bore 196 defines an opening that extends through the anchor block 124 and that is configured to align with the opening 168 through the outer insert 132 (see FIGS. 5 and 6). In use, as shown in FIG. 17, the actuation insert 136 can extend through both the opening (e.g., the support bore 196) of the anchor block 124 and the opening 168 of the outer insert 132.

Figure 11:
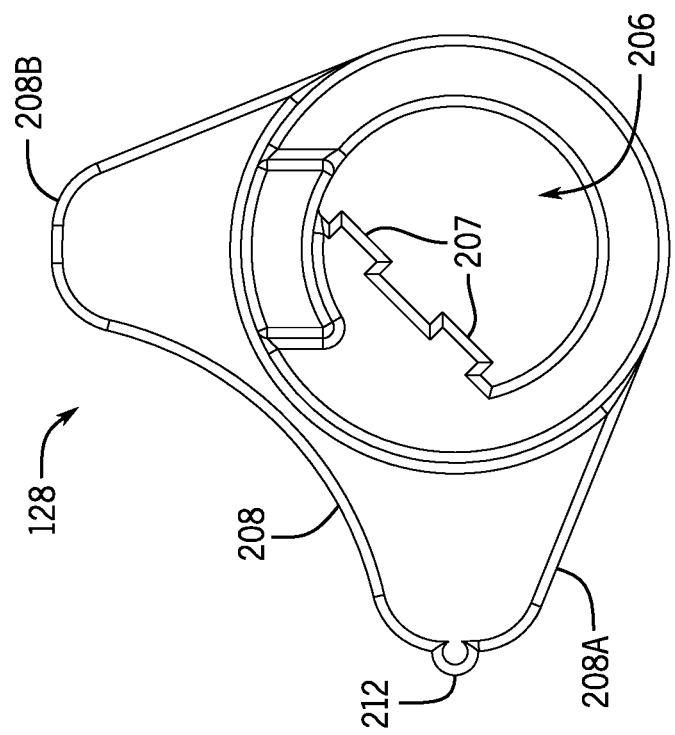
FIG. 11 is a cross-sectional bottom view of the locking body of the attachment assembly of FIG. 4 taken along line 11-11 of FIG. 10.

Referring now to FIGS. 10 and 11, a locking body 128, according to one embodiment, is shown. The locking body 128 is generally configured to be rotatably secured relative to the anchor block 124 so that the locking body 128 can be rotated from the outer side of the enclosure cover 104 between the unlocked orientation and the locked orientation, and vice versa. The locking body 128 includes a cavity 206 that is configured to receive the actuation insert 136. The cavity 206 also includes projections 207 configured to engage and secure the actuation insert 136 within the cavity 206.

Figure 16:
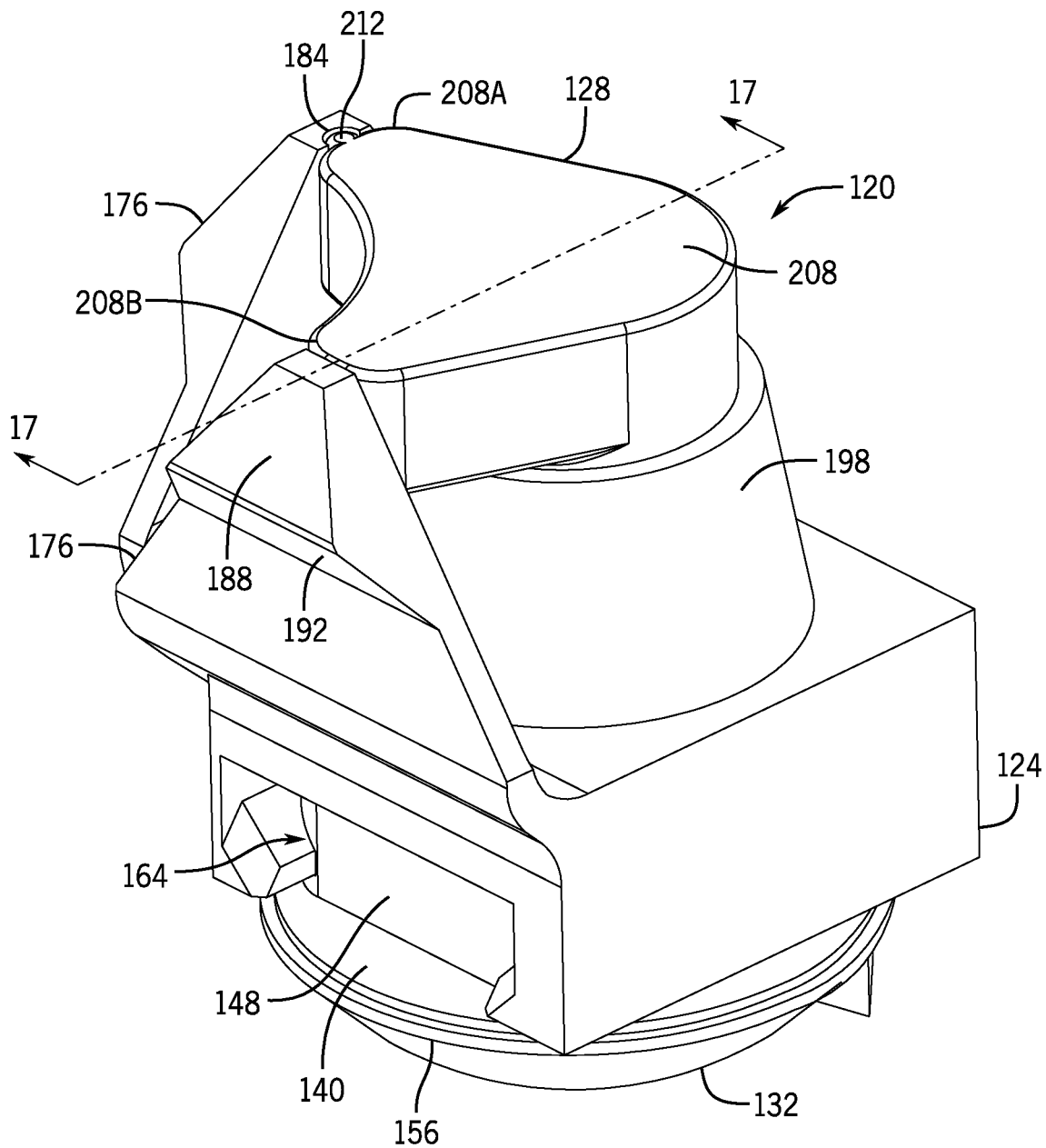
FIG. 16 is an isometric view of the attachment assembly of FIG. 4 in a locked orientation.

As illustrated, the locking body 128 includes a cam member 208. In the illustrated embodiment, the cam member 208 defines a generally lobed geometry and includes first and engaging portions 208A, 208B that are configured to selectively engage the flexible arms 176 depending on the orientation of the locking body 128. The first engaging portion 208A further includes a protrusion 212 extending therefrom. The protrusion 212 is configured to engage the recess 184 on the flexible arm 176 (see, e.g., FIG. 7) to provide a tactile or auditory response when the locking body 128 reaches the locked orientation, as shown in FIGS. 16 and 17. In other embodiments, a flexible arm can include a protrusion and one of first or second protrusions on a locking body can include a corresponding recess to enable a similar tactile or auditory response. As discussed above, the locking body 128 also includes the first stop 200. In the illustrated embodiment, the first stop 200 is generally radially aligned with the second engaging portion 208B of the cam member 208 so that the first stop 200 prevents the locking body 128 from rotating past the locked orientation once the first and second engaging portions 208A, 208B have engaged their respective flexible arms 176.

Figure 13:
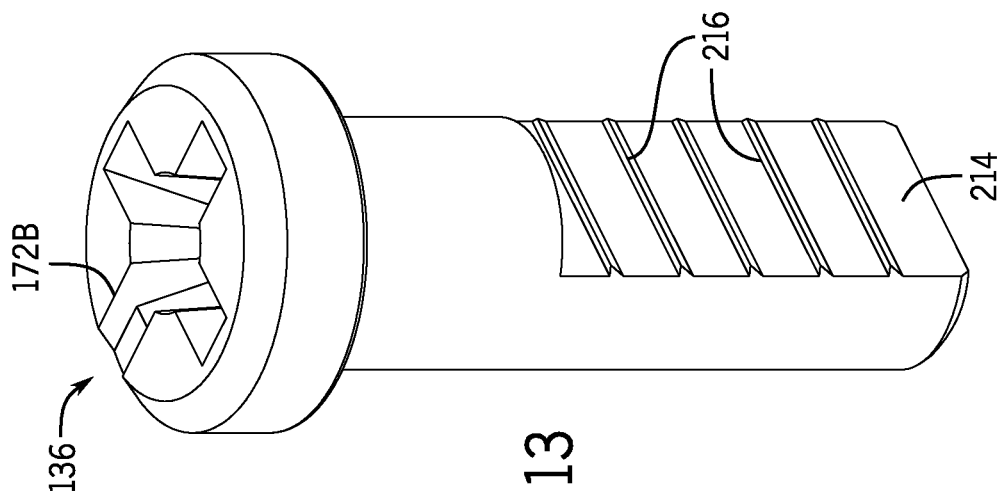
FIG. 13 is an isometric view of the actuation insert of the attachment assembly of FIG. 4.
Figure 12:
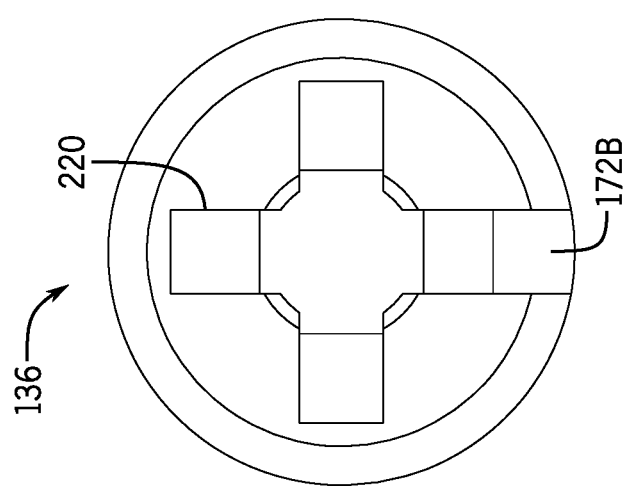
FIG. 12 is a plan view of an actuation insert of the attachment assembly of FIG. 4.
Figure 14:
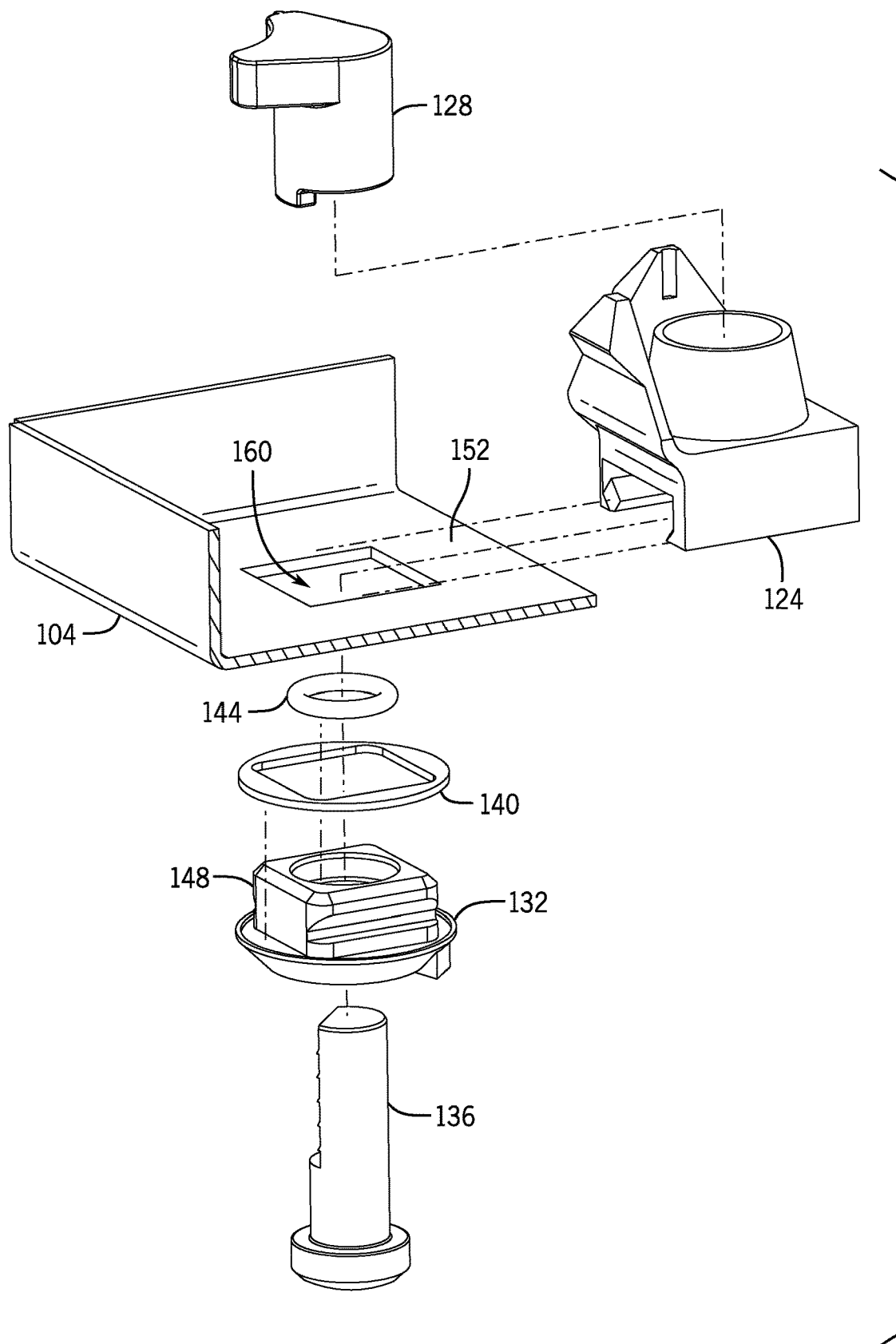
FIG. 14 is an exploded isometric partial view of the attachment system of FIG. 3

FIGS. 12 and 13 illustrate the actuation insert 136, according to one embodiment of the invention. As shown in FIGS. 14 and 17, for example, the actuation insert 136 is configured to extend from the outer side of the enclosure cover 104, through the outer insert 132, to engage the locking body 128. The actuation insert 136 is further configured to be rotatable from outside of the enclosure cover 104 and to rotate the anchor block 124 between the locked and unlocked orientations. In the illustrated embodiment, the actuation insert 136 includes a flat portion 214 disposed along a shaft. The flat portion 214 includes a plurality of ribs 216 that are configured to engage an inner surface of the cavity 206 of the locking body 128 including the projections 207 (see FIG. 11). The flat portion 214 and the ribs 216 also provide an engagement surface to rotate the anchor block 124 when the actuation insert 136 is rotated.

In some embodiments, the shaft of the actuation insert 136 further includes a recess 138 disposed at one end of the actuation insert 136. The recess 138 can be configured to engage a protrusion formed on the inner surface of the cavity 206 of the locking body 128 to create an interference fit with the locking body 128, thereby securing the attachment assembly 120 to the enclosure cover 104 (see, for example, FIG. 17). In some embodiments, other arrangements can be used to allow an actuation insert to rotate a locking body, including grooves on an actuation insert and ribs on a locking body or other complementary structural arrangements.

In one embodiment, the actuation insert 136 further includes a head that has channels 220 arranged similarly to that of a Phillips-head screw. In other embodiments, the actuation insert 136 may include other features that allow a user to rotate the actuation insert 136, such as, for example, a single channel configured to receive a flat-blade driver, or protruding wings or other features for tool-free engagement. As illustrated and as also discussed above, the actuation insert 136 further includes the indicator 172B that is configured to align with the indicator 172A on the outer insert 132 to provide an indication of when the attachment assembly 120 is in the locked orientation. In one embodiment, the indicator 172B is configured as an elongated portion of the channel 220. However, other configurations are possible. Any number of indicators, such as markings, dents, ridges, etc. may be used.

As shown in FIG. 14, the attachment assembly 120 is configured to be installed on the enclosure cover 104 via the opening 160. The opening 160 is dimensioned to receive part of the outer insert 132, such that the anchor portion 148 extends through the opening 160 from the outer side of the enclosure cover 104 to the inner side 152 of the enclosure cover 104. In particular, the opening 160 is shown as a square opening that receives the square profile of the anchor portion 148. Such a non-rounded profile may help prevent inadvertent rotation of the outer insert 132, although other configurations are possible.

During installation of the attachment system 100 onto the enclosure cover 104, the sealing gasket 140 is placed around an outer side of the anchor portion 148, such that the sealing gasket 140 can provide a seal between the outer insert 132 and the outer side of the enclosure cover 104 when the anchor portion 148 extends through the opening 160. Additionally, the O-ring 144 is placed on an inner side of the outer insert 132 within the anchor portion 148, so that the O-ring 144 creates a seal between the actuation insert 136 and the outer insert 132 when the actuation insert 136 is inserted through the opening 168 (see FIG. 5) of the outer insert 132.

As described above, the anchor portion 148 of the outer insert 132 and the anchor block 124 collectively include the rail and groove arrangement 164 that is configured to secure the anchor block 124 to the outer insert 132 as the anchor block 124 is slid along the inner side 152 of the enclosure cover 104. In some embodiments, a rail and groove arrangement can be contoured to urge an outer insert toward the outer side of the enclosure cover and, simultaneously, urge an anchor block toward the inner side of an enclosure cover, as the rail and groove arrangement is moved into an engaged configuration. In the illustrated embodiment, for example, ends of the rails 164B on the anchor block 124 (see, for example, FIG. 9) are angled so the rails 164B engage the grooves 164A (see, for example, FIG. 5) to urge the flange 156 of the outer insert 132 toward the enclosure cover 104 when the anchor block 124 is slid along the inner side 152 of the enclosure cover 104 into engagement with the outer insert 132.

Figure 15:
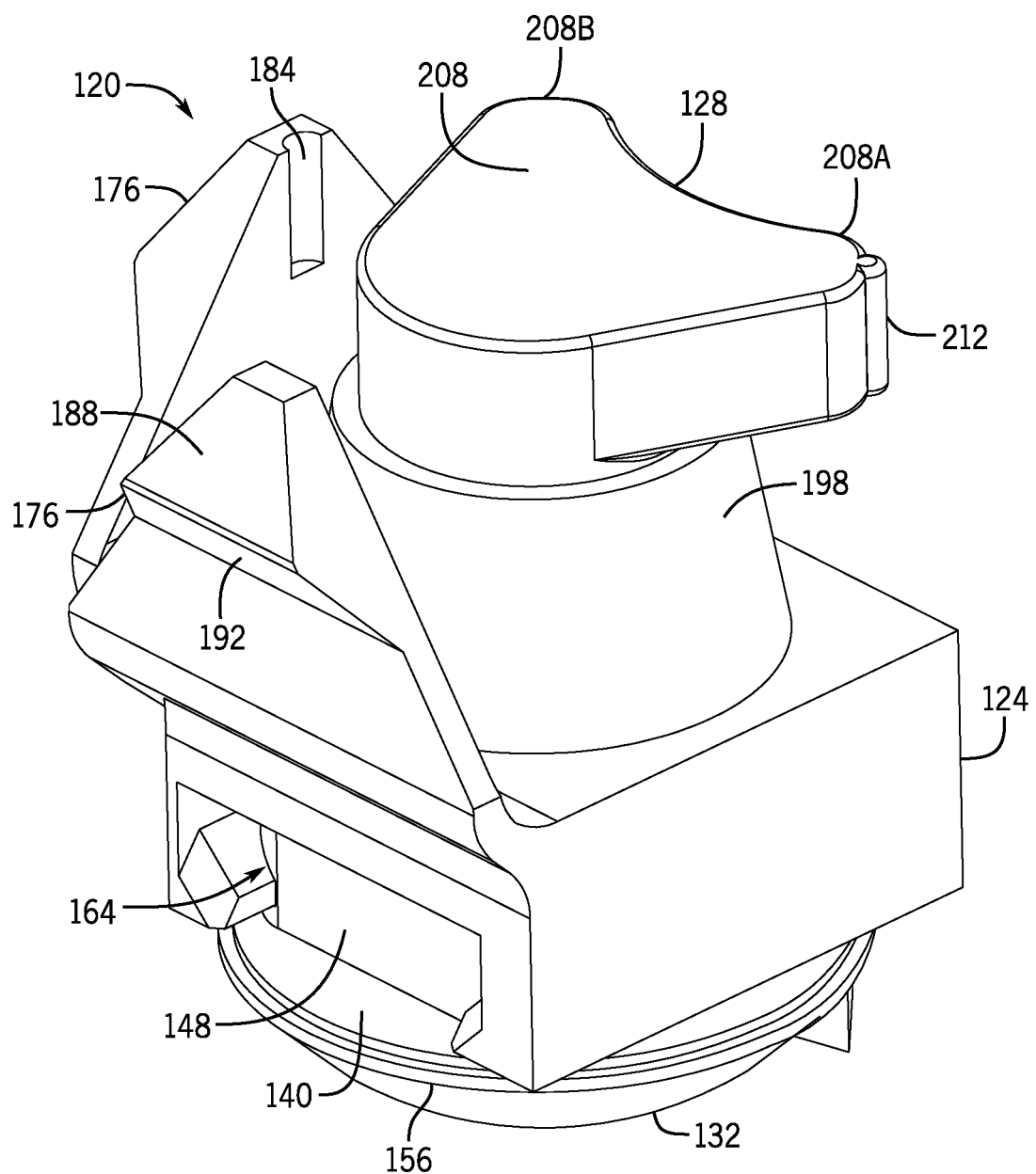
FIG. 15 is an isometric view of the attachment assembly of FIG. 4 in an unlocked orientation.

FIG. 15 illustrates one example of the attachment assembly 120 in an unlocked orientation. As shown, the engaging portions 208A, 208B of the locking body 128 extend generally away from and are not engaged with the flexible arms 176 of the anchor block 124. In the illustrated embodiment, each of the engaging portions 208A, 208B are rotated approximately 180° out of alignment relative to a corresponding one of the flexible arms 176, although other rotational angles of the locking body 128 relative to the collar 198 that correspond to the unlocked orientation are possible. For example, in some embodiments, the actuation insert 136 may be rotated less than (or more than) 180° to move the attachment assembly 120 between the locked orientation and the unlocked orientation. Because the flexible arms 176 are not engaged (or at least not fully engaged) by the engaging portions 208A, 208B in the unlocked orientation, the flexible arms 176 are allowed to flex away from the interior structure 180 of the enclosure during attachment or removal of the cover 104, to release the anchor block 124, and thereby the attachment assembly 120, relative to the enclosure body.

FIGS. 16-19 illustrate the attachment assembly 120 in the locked orientation, as corresponds to the orientation of each of the attachment assemblies 120 in FIG. 3. In the locked orientation, the engaging portions 208A, 208B of the locking body 128 engage the flexible arms 176 of the anchor block 124. As a result, the flexible arms 176 are secured against flexing out of engagement with the interior structure 180 of the enclosure, as illustrated in FIG. 3. Thus, with the attachment assembly 120 in the locked orientation, the flexible arms 176 rigidly engage the interior structure 180 to secure the cover 104 over the enclosure opening 108.

Illustrated in FIG. 17, as discussed above, when the attachment assembly 120 is assembled, the actuation insert 136 extends through each of the outer insert 132, the anchor block 124, and into the cavity 206 of the locking body 128. Additionally, the locking body 128 extends into the support bore 196 of the collar 198 with the cam member 208 outside the support bore 196 to engage the flexible arms 176 at each of the first and second engaging portions 208A, 208B. In some embodiments, an axial height of the cam member 208 can be increased to increase contact surface area between each of the engaging portions 208A, 208B and their respective flexible arms 176 (see, for example, FIGS. 22 and 23).

Figure 19:
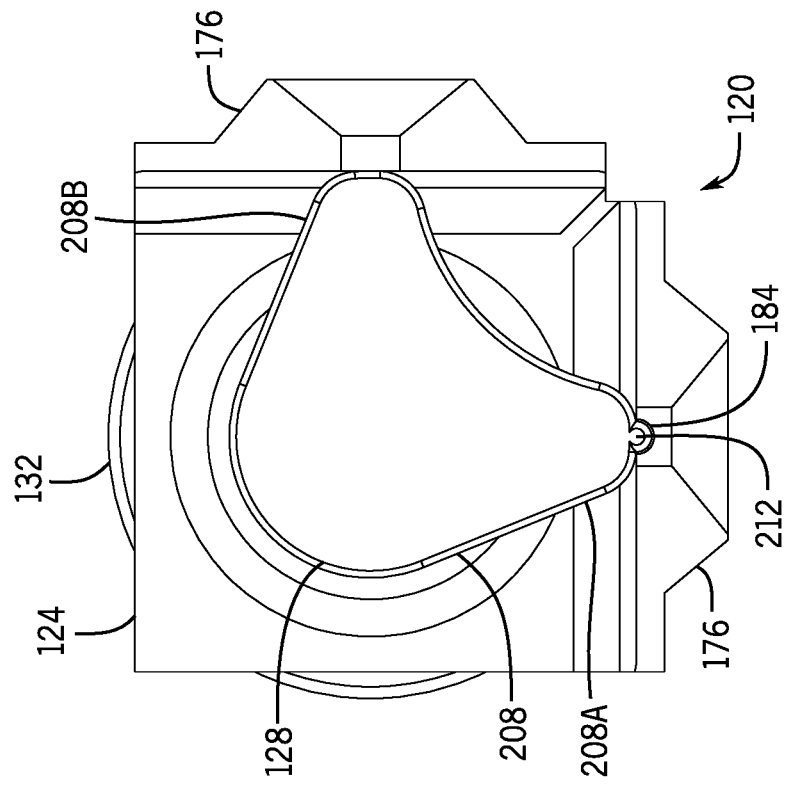
FIG. 19 is an isolated plan view of the attachment assembly of FIG. 4, from an interior side of the enclosure cover, with the attachment assembly in the locked orientation.

Further, as also shown in FIG. 19, when the attachment assembly 120 is in the locked orientation, the protrusion 212 of the engaging portion 208A engages the recess 184 of the flexible arm 176, which can help to secure the attachment assembly 120 against inadvertent movement out of the locked orientation, including due to impacts and vibrations. Further, as also noted above, the protrusion 212 can provide a tactile or auditory feedback to a user to confirm that the attachment assembly 120 has been placed into the locked orientation.

In different embodiments, flexible arms can be configured to engage different interior structures, or different locations on a particular interior structure. In some embodiments, it may be useful for multiple attachment assemblies to engage an interior structure (or structures) of an enclosure at opposing sides of an enclosure opening. For example, the flexible arms 176 can engage the interior structure 180 on opposite corners of the enclosure opening 108, as illustrated in FIG. 3. This can help not only to provide a secure engagement generally, but also allow the cover 104 to self-align, via engagement of the arms 176 with the interior structure 180, as the cover 104 is installed at the opening 108.

Similarly, in some embodiments, it may be useful for multiple flexible arms of an attachment assembly to engage an interior structure (or structures) on opposing (e.g., orthogonal) sides of a corner of an enclosure opening. This configuration is also illustrated in FIG. 3 and can also help to provide a more secure and self-aligning engagement, in some configurations.

Additionally, FIG. 17, in particular, illustrates the lack of conductive path through the attachment assembly 120 that results from the composite locking body 128, anchor block 124, and outer insert 132 fully surrounding the metal actuation insert 136. In some embodiments, a similarly non-conductive arrangement can be obtained by securing an actuation insert to a locking body using a non-metallic fastener, such as a composite screw that extends axially through the locking body 128, from the interior of an enclosure, to engage the actuation insert.

Figure 18:
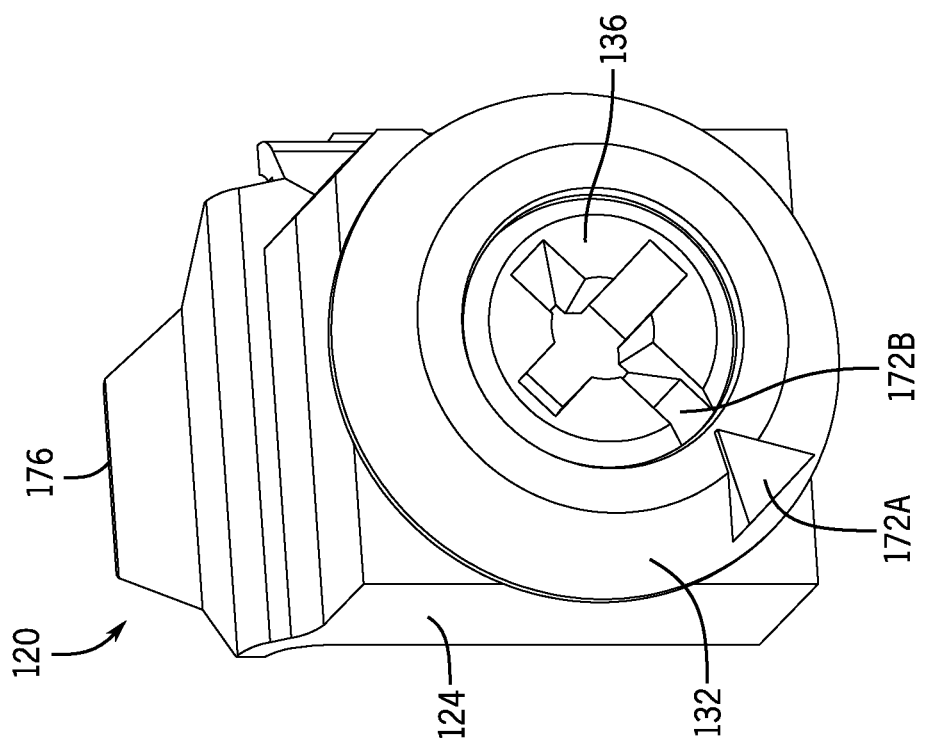
FIG. 18 is an isolated isometric view of the attachment assembly of FIG. 4, from an exterior side of the enclosure cover, with the attachment assembly in the locked orientation.

Additional details of the attachment assembly 120 in the locked orientation are shown in FIGS. 18 and 19. For example, FIG. 18 illustrates the alignment of the indicator 172A of the outer insert 132 with the indicator 172B of the actuation insert 136 to visually indicate to a user that the attachment assembly 120 is in the locked orientation. Specifically, the elongated portion of the channel 220 is aligned with a point of the triangular indentation of the outer flange 156, although other configurations are also possible. In other embodiments, the elongated channel or other similar feature may align with another visual representation, such as a lock symbol, to indicate the location to which the actuation insert 136 must be turned to place the anchor block 124 in the locked orientation.

FIGS. 20-23 illustrate components of an attachment assembly 320 according to another embodiment of the invention. The attachment assembly 320 is generally similar in structure and operation to the attachment assembly 120, so discussion of the attachment assembly 120 generally also applies to the attachment assembly 320, and vice versa. However, in some regards the attachment assembly 320 differs from the attachment assembly 120, including as further discussed below.

Figure 21:
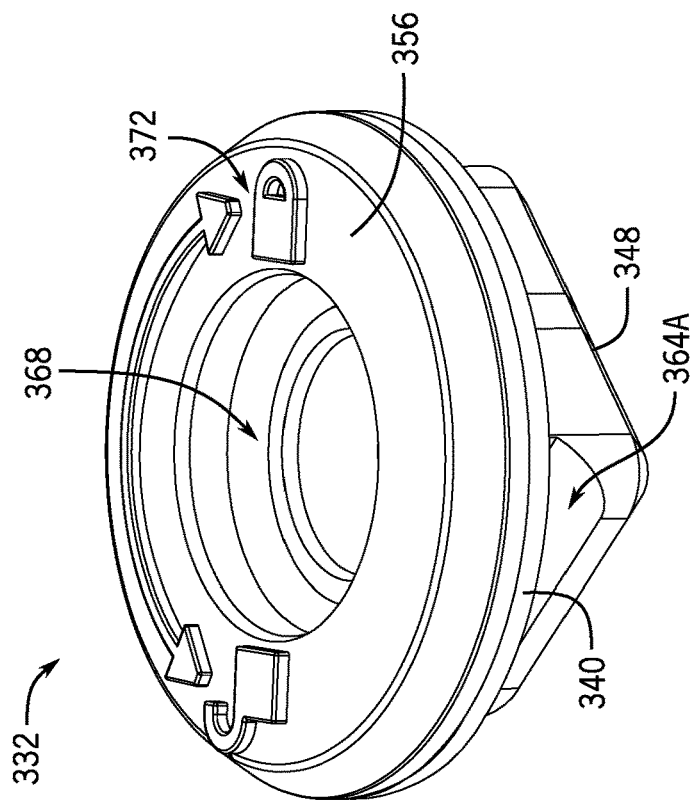
FIG. 21 is a top isometric view of the outer insert of FIG. 20.
Figure 20:
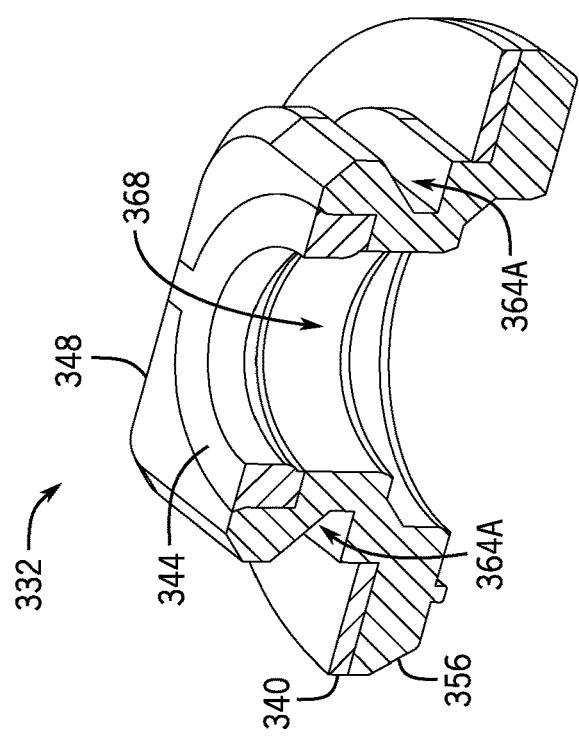
FIG. 20 is a cross-sectional bottom isometric view of an outer insert for an attachment assembly according to another embodiment of the invention.

Referring to FIGS. 20 and 21, the attachment assembly, similar to the attachment assembly 120, includes an outer insert 332. The outer insert 332 includes an anchor portion

348 that is configured to extend from an outer side of an enclosure cover to an inner side of an enclosure cover (e.g., via a hole through the enclosure cover with similar geometry). The outer insert 332 further includes an outer flange 356 that is configured to seat against the outer side of an enclosure cover. The anchor portion 348 includes part of a rail and groove arrangement that is configured to secure an anchor block 324 to the outer insert 332 as the anchor block 324 is slid along the inner side of the enclosure. The rail and groove arrangement includes a set of grooves 364A that are configured to receive corresponding rails 364B of the anchor block 324.

Although a rail and groove arrangement may be both robust and easy to install, including as detailed above, an anchor block may be otherwise secured to an enclosure cover in some embodiments. For example, an anchor block can be secured to the inside of an enclosure cover by other mechanical engagements with an outer insert or another structure of an attachment assembly or enclosure cover. In some cases, an anchor block can be secured to the inside of an enclosure cover in alignment with (e.g., on or surrounding) an opening through the enclosure door, but without an outer insert or other component necessarily extending through the opening to engage the anchor block. Further, in some cases, an anchor block and outer insert may be effectively combined as a single integral component (e.g., of a resilient polymer) that can be secured to extend partly (e.g., only partly) to the interior of an enclosure cover.

Similar to the attachment assembly 120, the attachment assembly 320 also includes a sealing gasket 340 and an O-ring 344. In the illustrated embodiment, the sealing gasket 340 is fixed to the outer flange 356 around the anchor portion 348 of the outer insert 332 so that when the outer insert 332 is installed in an enclosure cover, the sealing gasket 340 is seated between the exterior surface of the enclosure cover and the outer flange 356. In some embodiments, the sealing gasket 340 can be integrally molded with the outer insert 332 via a bi-material molding process. In the illustrated embodiment, the O-ring 344 is seated within an opening 368 of the outer insert 332. Similar to the sealing gasket 340, the O-ring can be integrally molded with the outer insert 332 via a bi-material molding process. In some embodiments, other sealing members (or no sealing members) of generally known configurations can also be used, as appropriate.

With reference to FIG. 21, the outer insert 332 further includes an indicator 372. Like the outer insert 332, the indicator 372 is disposed at an outer surface of the outer flange 356. In the illustrated embodiment, the indicator 372 is configured as an arrow with lock and unlock markings. In use, the indicator 372 is configured to align with a corresponding indicator (not shown) on an actuation insert 336 (see FIG. 23) depending on the current state of the attachment assembly 320. For example, the unlock symbol of the indicator 372 may be aligned with the indicator on the actuation insert 336 when the attachment assembly 320 is in an unlocked orientation and the lock symbol of the indicator 372 may be aligned with the indicator on the actuation insert 336 when the attachment assembly 320 is in a locked orientation.

Figure 22:
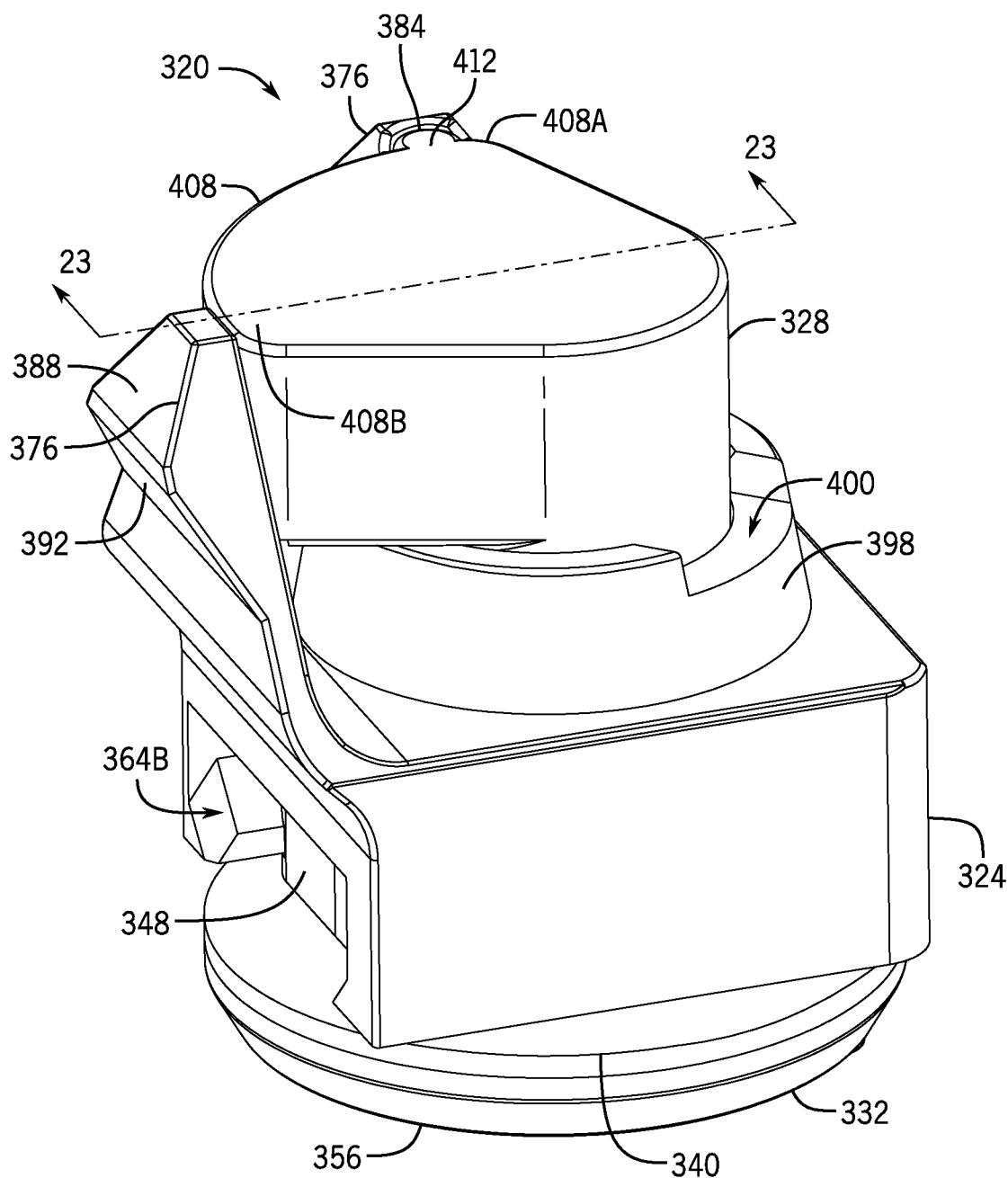
FIG. 22 is an isometric view of an attachment assembly, including the insert of FIG. 20, according to another embodiment of the invention.
Figure 23:
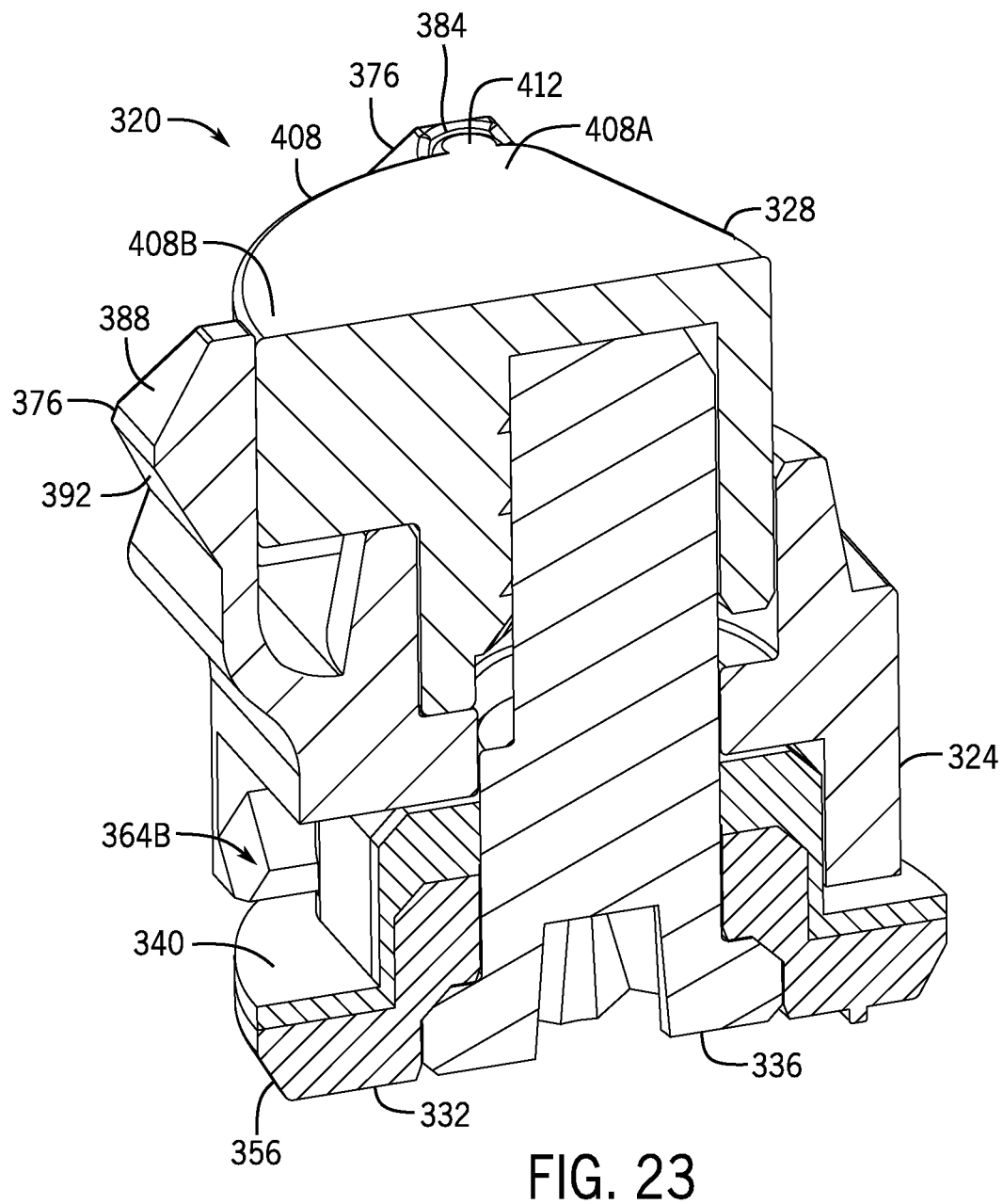
FIG. 23 is a cross-sectional isometric view of the attachment assembly of FIG. 22 taken along line 23-23 of FIG. 22.

FIGS. 22 and 23 illustrate the attachment assembly 320 in the locked orientation. The attachment assembly 320 can be moved between the locked orientation and the unlocked orientation (and vice versa) in a substantially similar manner as the attachment assembly 120 (e.g., rotating the actuation insert 336 to rotate a locking body 328 and move a cam member 408 of the locking body 328 in and out of engagement with flexible arms 376 of the anchor block 324). In this regard, and like the attachment assembly 120, the anchor block 324 of the attachment assembly 320 has flexible arms 376. One of the flexible arms includes a recess 384 that can provide a tactile or auditory response when engaging a protrusion 412 of an engaging portion 408A of the cam member 408. Like the locking body 128, the locking body 328 also includes a second engaging portion 408B of the cam member 408 that is configured to engage and outwardly urge the other flexible arm 376.

In the illustrated embodiment, the flexible arms 376 of the anchor block 324 include a first oblique surface 388 and a second oblique surface 392, similar to the flexible arms 376 of the anchor block 324. The first oblique surface 388 is configured to urge the flexible arms 376 to flex away from an interior structure of the enclosure as the enclosure cover is moved toward the enclosure when the attachment assembly 320 is in the unlocked orientation. The second oblique surface 392 is configured to urge the flexible arms 376 to flex away from the interior structure as the enclosure cover is move away from the enclosure when the attachment assembly 320 is in the unlocked orientation. The anchor block 324 further includes a collar 398 having a notch 400 defining a bore in which the locking body 328 can rotate. In some embodiments, the notch 400 can be configured to facilitate disassembly of the locking body 328 from the anchor block 324. For example, when the attachment assembly 320 is in the unlocked orientation, a tool (e.g., a flat blade screwdriver) can be inserted into the notch 400 to urge the locking body 328 out of engagement with the anchor block 324.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

Correspondingly, some embodiments of the invention include methods of using an attachment assembly (e.g., the attachment assembly 120), as part of an attachment system, to secure an enclosure cover to an enclosure opening. Generally, before the enclosure cover can be secured to the enclosure opening, each (or some) of the attachment assemblies of the attachment system can be placed in the unlocked orientation. The enclosure cover may then be oriented so that each of the attachment assemblies is aligned with a respective interior structure of the enclosure (e.g., a respective corner of the enclosure opening). The enclosure cover may then be moved to cover the enclosure opening, thereby engaging each of the flexible arms of each of the attachment assemblies with the corresponding interior structure of the enclosure.

When each of the flexible arms engage the interior structure, contact between the interior surface and a first set of oblique surfaces of the flexible arms can allow the end portion of the flexible arms to move (e.g., snap) past part of the interior structure. Thus, the flexible arms may resiliently engage the interior structure to hold the enclosure cover in place. The enclosure cover may then be secured to the enclosure opening, from the outer side of the enclosure cover, by rotating the actuation insert of each attachment assembly, thereby rotating the associated locking body to the locked orientation so that the flexible arms of the anchor block (e.g., at a set of second oblique surfaces) are held in a secure engagement with the corresponding interior structure.

To release the attachment system and remove the enclosure cover from the enclosure opening, each of the actuation inserts can be rotated, from the outer side of the enclosure cover, to place the locking bodies in the unlocked orientation. In the unlocked orientation, as also detailed above, the locking bodies are disengaged from the corresponding flexible arms so that the flexible arms can again flex to move past the associated interior structure. In this regard, when the enclosure cover is moved away from the enclosure opening, a second set of oblique surfaces of the flexible arms can contact the interior structure to urge the flexible arms to flex away from the interior structure to be disengaged from the enclosure generally.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An attachment system to secure an enclosure cover to an enclosure, the attachment system comprising:
   an outer insert including an anchor portion, the outer insert configured to extend through the enclosure cover from an outer side of the enclosure cover to an inner side of the enclosure cover;
   an anchor block including a first flexible arm and a second flexible arm that are offset from each other by 90 degrees on the anchor block to engage an interior corner structure of an enclosure opening of the enclosure, the anchor block being securable to the anchor portion of the outer insert to be located at the inner side of the enclosure cover when the outer insert extends through the enclosure cover; and
   a locking body having a cam member, the locking body being rotatably secured relative to the anchor block to be rotatable from the outer side of the enclosure cover between:
      a locked orientation, in which the cam member prevents the first and second flexible arms from flexing away from the interior corner structure of the enclosure and thereby secures the anchor block and the enclosure cover relative to the enclosure; and
      an unlocked orientation, in which the cam member allows the first and second flexible arms to flex away from the interior corner structure of the enclosure and thereby releases the anchor block and the enclosure cover relative to the enclosure.

2. The attachment system of claim 1, further comprising:
   an actuation insert configured to extend through the outer insert, the anchor block, and into the locking body, the actuation insert rotatable from outside of the enclosure to rotate the locking body between the locked and unlocked orientations.

3. The attachment system of claim 1, wherein the cam member includes an engaging portion, the engaging portion having a protrusion configured to extend into a recess of the first flexible arm to provide one or more of a tactile response or an auditory response when the locking body reaches the locked orientation.

4. The attachment system of claim 1, wherein the cam member includes first and second engaging portions that are offset from each other by 90 degrees, to prevent the respective first and second flexible arms from being urged away from the interior corner structure of the enclosure to secure the anchor block relative to the enclosure when the locking body is in the locked orientation.

5. The attachment system of claim 4, wherein the first and second flexible arms are arranged to engage the interior corner structure of the enclosure on opposite orthogonal sides of a corresponding corner of the enclosure opening.

6. The attachment system of claim 4, wherein the first engaging portion includes a first lobe of the cam member and the second engaging portion includes a second lobe of the cam member.

7. The attachment system of claim 1, wherein the anchor block and the anchor portion of the outer insert collectively include a rail and groove arrangement that is configured to secure the anchor block to the outer insert as the anchor block is slid along an inner side of the enclosure cover.

8. The attachment system of claim 7, wherein the rail and groove arrangement is contoured to urge an outer flange of the outer insert towards the enclosure cover as the anchor block is slidably engaged with the anchor portion.

9. The attachment system of claim 1, wherein a first stop on the locking body is configured to contact a second stop on the anchor block to prevent rotation of the locking body past the locked orientation.

10. The attachment system of claim 1, wherein the anchor block includes a support bore formed through a collar that rotatably receives the locking body.

11. The attachment system of claim 1, wherein the first flexible arm includes an end portion with a first oblique surface that is configured to urge the first flexible arm to flex away from the interior corner structure of the enclosure as the enclosure cover is moved towards the enclosure, with the locking body in the unlocked orientation, to cover the enclosure opening.

12. The attachment system of claim 11, wherein the end portion includes a second oblique surface that is configured to urge the first flexible arm to flex away from the interior corner structure of the enclosure as the enclosure cover is moved away from the enclosure, with the locking body in the unlocked orientation, to open the enclosure opening.

13. An attachment system for an enclosure with an enclosure opening that includes a first corner and a second corner, the attachment system comprising:
   an enclosure cover, the enclosure cover including a first cover opening and a second cover opening that extend between an inner side and an outer side of the enclosure cover
   a first attachment assembly that engages the enclosure cover at the first cover opening; and
   a second attachment assembly that engages the enclosure cover at the second cover opening;
   each of the first and second attachment assemblies including:
      an anchor block that is secured relative to the inner side of the enclosure cover in alignment with a respective one of the first or second cover openings, and that includes one or more flexible arms configured to extend into the enclosure opening to engage a respective interior structure of the enclosure at a respective one of the first or second corners of the enclosure opening; and a locking body that includes a cam member, the locking body being rotatably secured to the anchor block;

each of the locking bodies being rotatable, from the outer side of the enclosure cover, to be rotated relative to the corresponding anchor block between:

a locked orientation, in which the cam member engages the one or more flexible arms to prevent the one or more flexible arms from flexing away from the respective interior structure of the enclosure, the one or more flexible arms thereby securing the enclosure cover to the enclosure; and an unlocked orientation, in which the cam member allows the one or more flexible arms to flex away from the respective interior structure of the enclosure and thereby release the enclosure cover from the enclosure.

14. The attachment system of claim 13, with the first cover opening being in a first corner region of the enclosure cover and the second cover opening being in a second corner region of the enclosure cover, wherein the one or more flexible arms for each of the first and second attachment assemblies include, respectively, a first flexible arm and a second flexible arm; and wherein with the cover installed on the enclosure, for each of the first and second attachment assemblies, the first and second flexible arms flexibly engaging the corresponding interior structure on adjacent sides of the respective first or second corner of the enclosure opening, with the first flexible arm engaging the enclosure at a different side of the first or second corner of the enclosure opening, respectively, than the second flexible arm, to secure the enclosure cover to the enclosure.

15. The attachment system of claim 13, wherein each of the first and second attachment assemblies further includes an outer insert with: an anchor portion that extends inside of the enclosure cover at a respective one of the first or second cover openings, and an outer flange that extends outside of the enclosure cover at the respective one of the first or second cover openings; and wherein the anchor block is secured to the anchor portion to secure the first or second attachment assembly, respectively, to the enclosure cover.

16. The attachment system of claim 15, wherein an actuation insert extends through the outer insert and the anchor block, and into a cavity of the locking body, the cavity of the locking body surrounding the actuation insert within the enclosure so that a conductive path is not formed from the outer side of the enclosure cover to the inner side of the enclosure cover via the actuation insert.

17. A method of securing an enclosure cover to an enclosure, the method comprising:

ensuring that each attachment assembly of a plurality of attachment assemblies is in an unlocked orientation, each of the attachment assemblies of the plurality of attachment assemblies being engaged with the enclosure cover at a corresponding cover opening of a plurality of cover openings;

orienting the enclosure cover so that each of the attachment assemblies of the plurality of attachment assemblies is aligned with a respective corner of an enclosure opening of the enclosure;

moving the enclosure cover toward the enclosure to flexibly engage two flexible arms of each of the attachment assemblies of the plurality of attachment assemblies with orthogonal sides of the respective corner of the enclosure opening, with a first flexible arm of the flexible arms of each of the attachment assemblies of the plurality of attachment assemblies offset by 90 degrees from a second flexible arm of the flexible arms of the respective attachment assembly; and securing the enclosure cover at the enclosure opening by, from an outer side of the enclosure cover, rotating a locking body of each of the attachment assemblies of the plurality of attachment assemblies to secure the two flexible arms of the respective attachment assembly in locked engagement with the orthogonal sides of the respective corner of the enclosure opening.

18. The method of claim 17, wherein moving the enclosure cover toward the enclosure causes end portions of the flexible arms to snap past corresponding interior structures of the enclosure that define the orthogonal sides of the respective corners.

19. The method of claim 17, further comprising:

from an outer side of the enclosure cover, rotating the locking body of each of the attachment assemblies of the plurality of attachment assemblies to release the two flexible arms of the attachment assembly from the locked engagement with the orthogonal sides of the respective corner of the enclosure opening; and moving the enclosure cover away from the enclosure opening.

20. The method of claim 19, wherein moving the enclosure cover away from the enclosure opening causes end portions of the flexible arms to snap past corresponding interior structures of the enclosure that define the orthogonal sides of the respective corners.

* * * * *